(12) United States Patent
Isohata

(10) Patent No.: US 11,817,825 B2
(45) Date of Patent: Nov. 14, 2023

(54) OSCILLATOR

(71) Applicant: SEIKO EPSON CORPORATION, Tokyo (JP)

(72) Inventor: Kensaku Isohata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/894,505

(22) Filed: Aug. 24, 2022

(65) Prior Publication Data
US 2023/0065998 A1    Mar. 2, 2023

(30) Foreign Application Priority Data

Aug. 26, 2021  (JP) ................................. 2021-137812

(51) Int. Cl.
H03B 5/32    (2006.01)
H03B 5/04    (2006.01)
H03L 7/197   (2006.01)
H03L 7/099   (2006.01)

(52) U.S. Cl.
CPC .............. H03B 5/32 (2013.01); H03B 5/04 (2013.01); H03L 7/099 (2013.01); H03L 7/1974 (2013.01); H03B 2200/0018 (2013.01); H03B 2200/0088 (2013.01)

(58) Field of Classification Search
CPC ...................................................... H03B 5/32
USPC ............................................................ 331/158
See application file for complete search history.

(56) References Cited

U.S. PATENT DOCUMENTS 9,853,628 B1 *   12/2017   Chen .................. H10N 30/85
2017/0373637 A1 * 12/2017   Kondo ................ H03H 9/08
2020/0235701 A1   7/2020    Nomura

FOREIGN PATENT DOCUMENTS

JP         2020-120159 A      8/2020

* cited by examiner

*Primary Examiner* — Joseph Chang
(74) *Attorney, Agent, or Firm* — Rankin, Hill & Clark LLP

(57) ABSTRACT

An oscillator includes a first resonator element, a circuit element configured to oscillate the first resonator element to generate an oscillation signal, a first package which includes a substrate, and has a housing space configured to house the first resonator element and the circuit element at one principal surface side of the substrate, a second resonator element which is disposed at another principal surface side of the substrate, and an oscillation frequency of which is controlled based on the oscillation signal, and a leg part which is disposed at the another principal surface side of the substrate, and which is arranged so as to surround the second resonator element in a plan view of the substrate.

20 Claims, 17 Drawing Sheets

OSCILLATOR

The present application is based on, and claims priority from JP Application Serial Number 2021-137812, filed Aug. 26, 2021, the disclosure of which is hereby incorporated by reference herein in its entirety.

BACKGROUND

1. Technical Field

The present disclosure relates to an oscillator.

2. Related Art

An oven-controlled crystal oscillator (OCXO) described in JP-A-2020-120159 (Document 1) has a first container for housing a first resonator element and a first circuit element for oscillating the first resonator to generate a first oscillation signal, wherein on a lower surface of the first container, there is mounted a second container for housing a second resonator element the oscillation frequency of which is controlled based on the first oscillation signal. Further, the oven-controlled crystal oscillator is further provided with a third container constituted by a base substrate for supporting the first container via a lead frame, and a cover bonded to the base substrate so as to house the first container and the second container inside.

However, in the oven-controlled crystal oscillator in Document 1, when omitting the third container in order to achieve reduction in size of a device, the second container is exposed to the outside, and becomes easy to be affected by a wind. Therefore, it becomes easy to be affected by a temperature fluctuation due to a wind, and there is a possibility that the noise characteristic of an output signal becomes worse.

SUMMARY

An oscillator according to the present disclosure includes a first resonator element, a circuit element configured to oscillate the first resonator element to generate an oscillation signal, a first package which includes a substrate, and has a housing space configured to house the first resonator element and the circuit element at one principal surface side of the substrate, a second resonator element which is disposed at another principal surface side of the substrate, and an oscillation frequency of which is controlled based on the oscillation signal, and a leg part which is disposed at the another principal surface side of the substrate, and which is arranged so as to surround the second resonator element in a plan view of the substrate.

DESCRIPTION OF EXEMPLARY EMBODIMENTS

Some preferred embodiments of an oscillator according to the present disclosure will hereinafter be described in detail based on the accompanying drawings. It should be noted that in each of the drawings, there are illustrated an X axis, a Y axis, and a Z axis perpendicular to each other for the sake of convenience of explanation. Further, hereinafter, a direction parallel to the X axis is also referred to as an "X-axis direction," a direction parallel to the Y axis is also referred to as a "Y-axis direction," and a direction parallel to the Z axis is also referred to as a "Z-axis direction." Further, an arrow side of each of the axes is also referred to as a "positive side," and an opposite side is also referred to as a "negative side." Further, the positive side in the Z-axis direction is also referred to as an "upper side," and the negative side in the Z-axis direction is also referred to as a "lower side." Further, a plan view viewed from the Z-axis direction is also referred to simply as a "plan view."

First Embodiment

Figure 1:
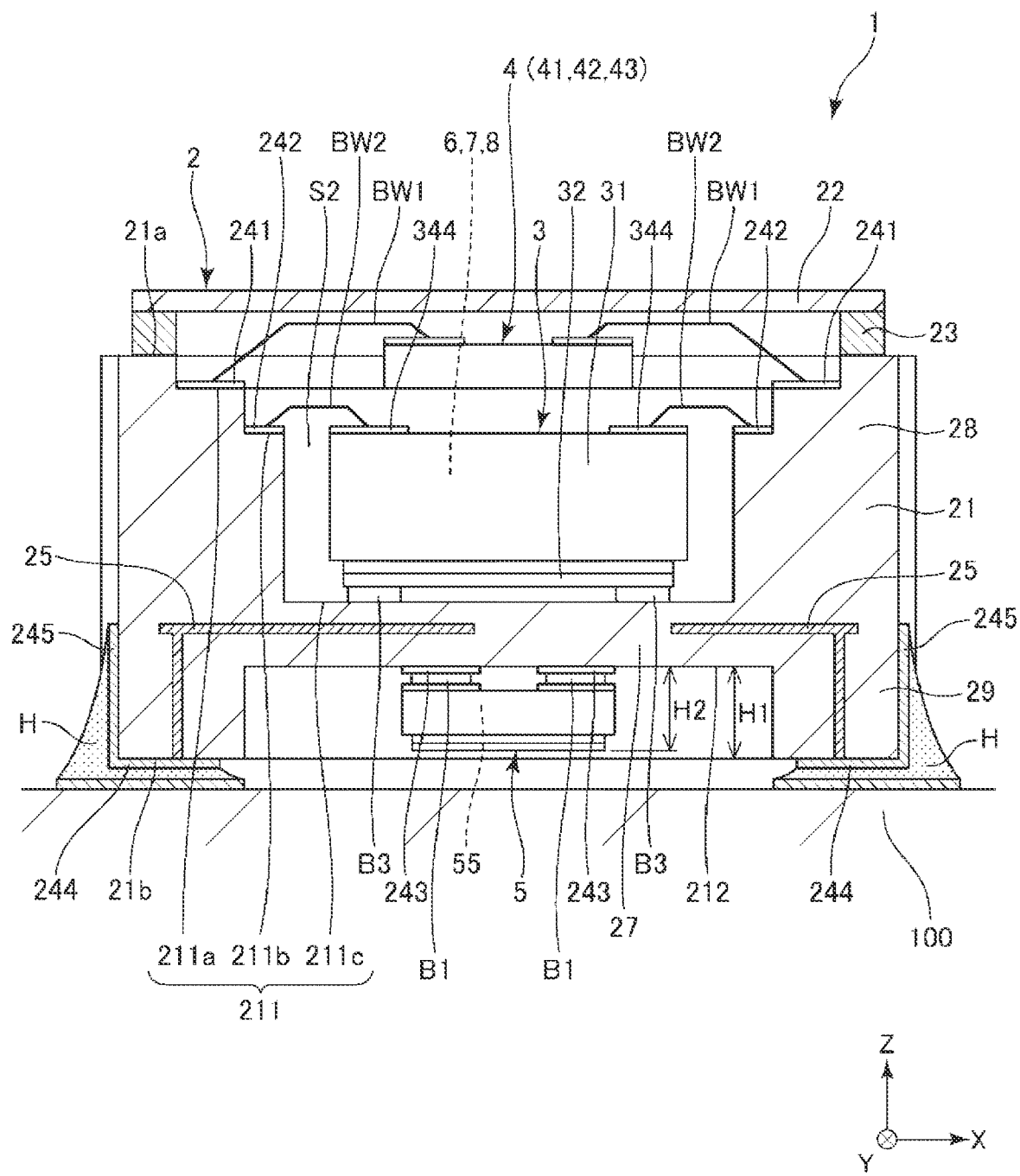
FIG. 1 is a cross-sectional view showing an oscillator according to a first embodiment.
Figure 2:
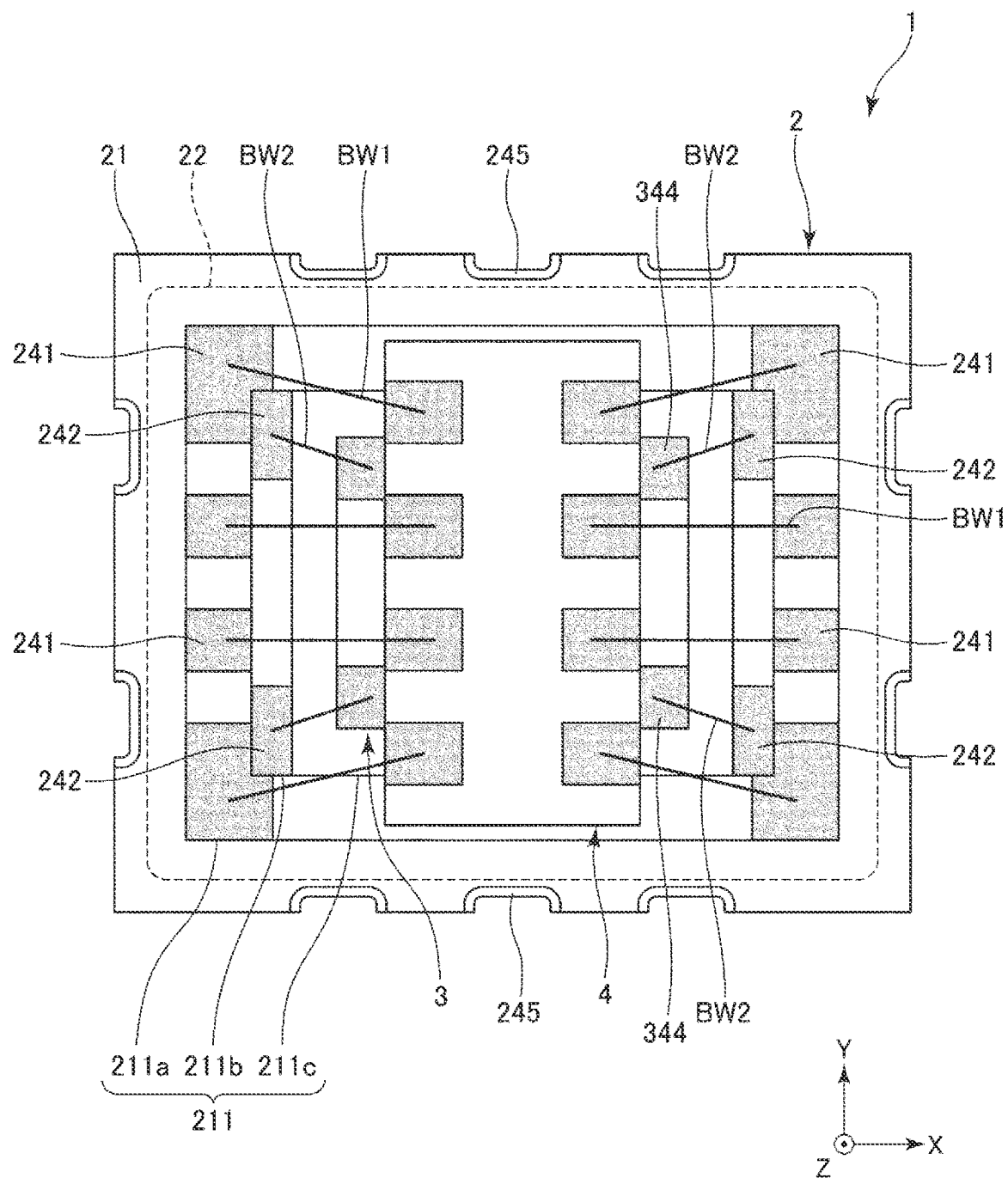
FIG. 2 is a plan view of the oscillator viewed from an upper surface side.
Figure 3:
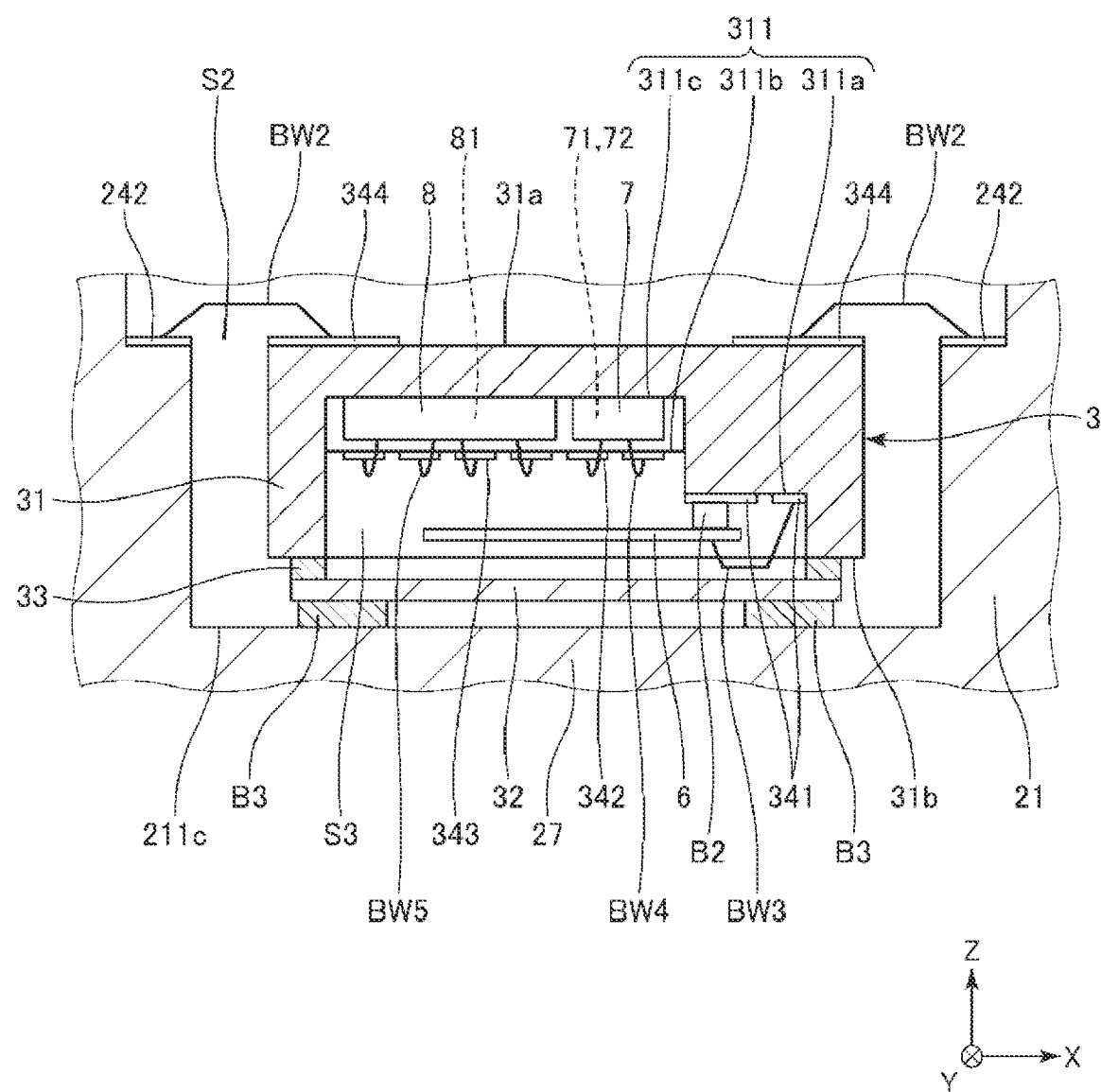
FIG. 3 is a cross-sectional view showing an inner package provided to the oscillator, and an inside of the inner package.
Figure 4:
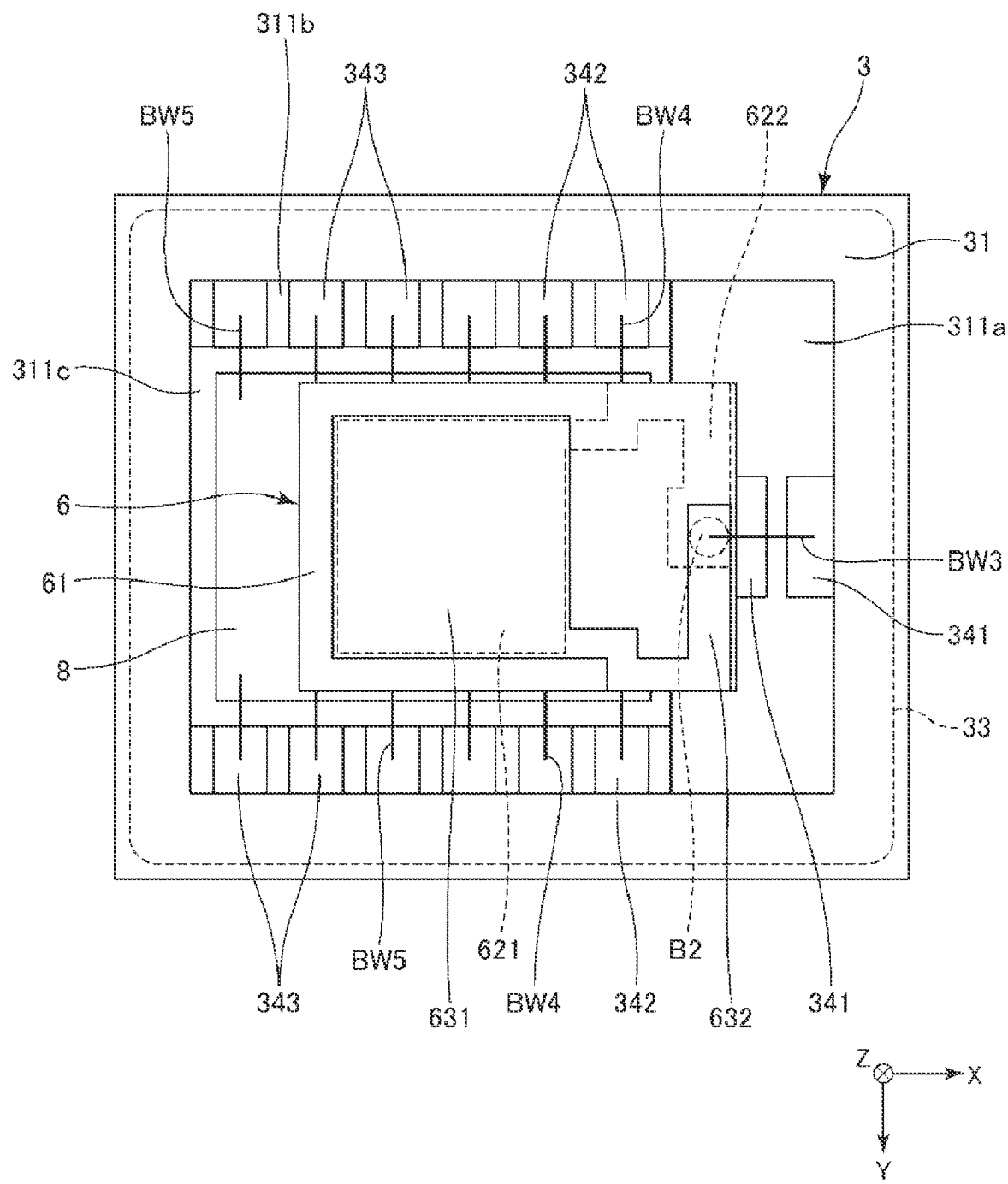
FIG. 4 is a plan view of the inner package viewed from a lower surface side.
Figure 5:
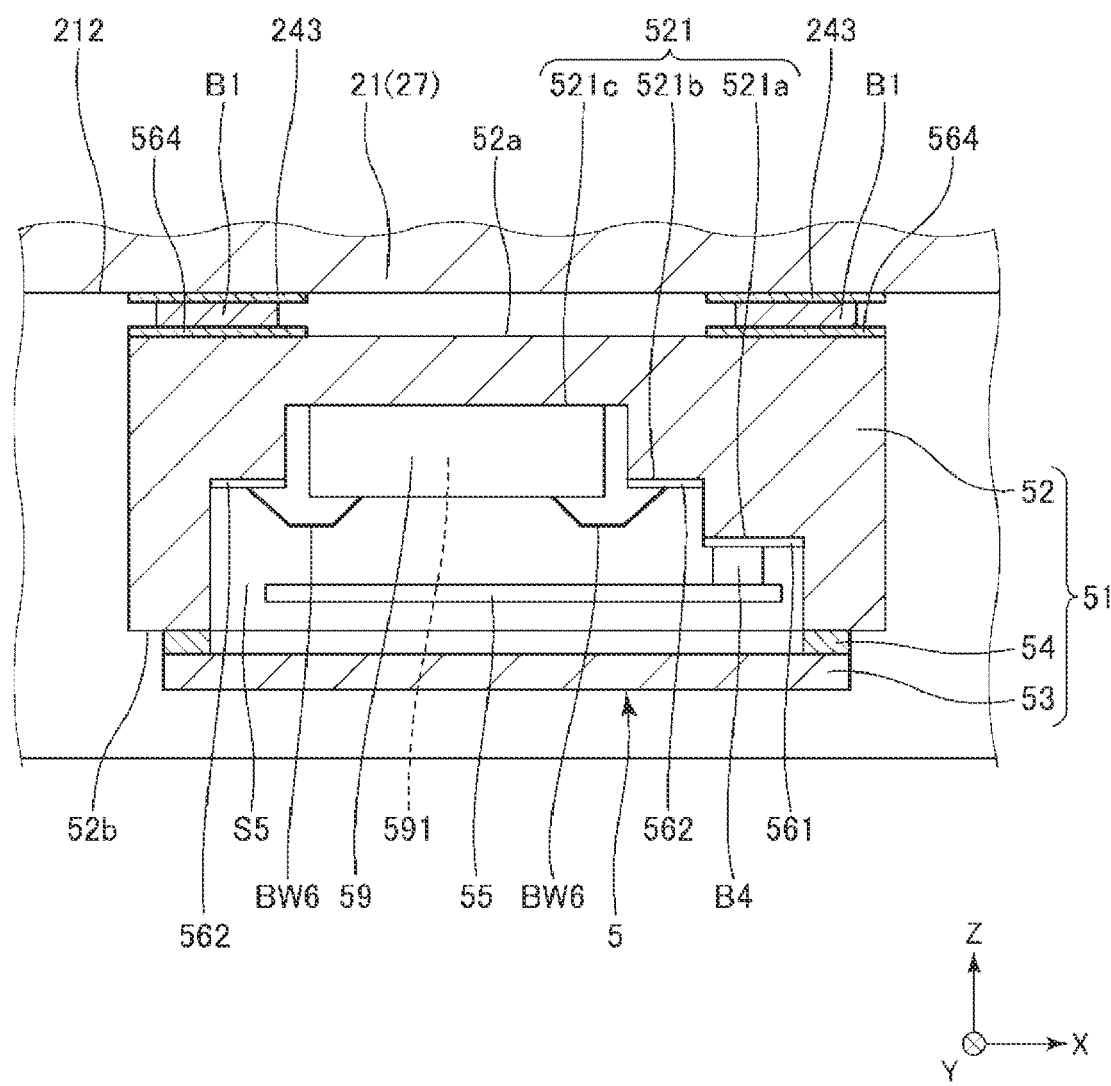
FIG. 5 is a cross-sectional view showing a voltage-controlled crystal oscillator provided to the oscillator.
Figure 6:
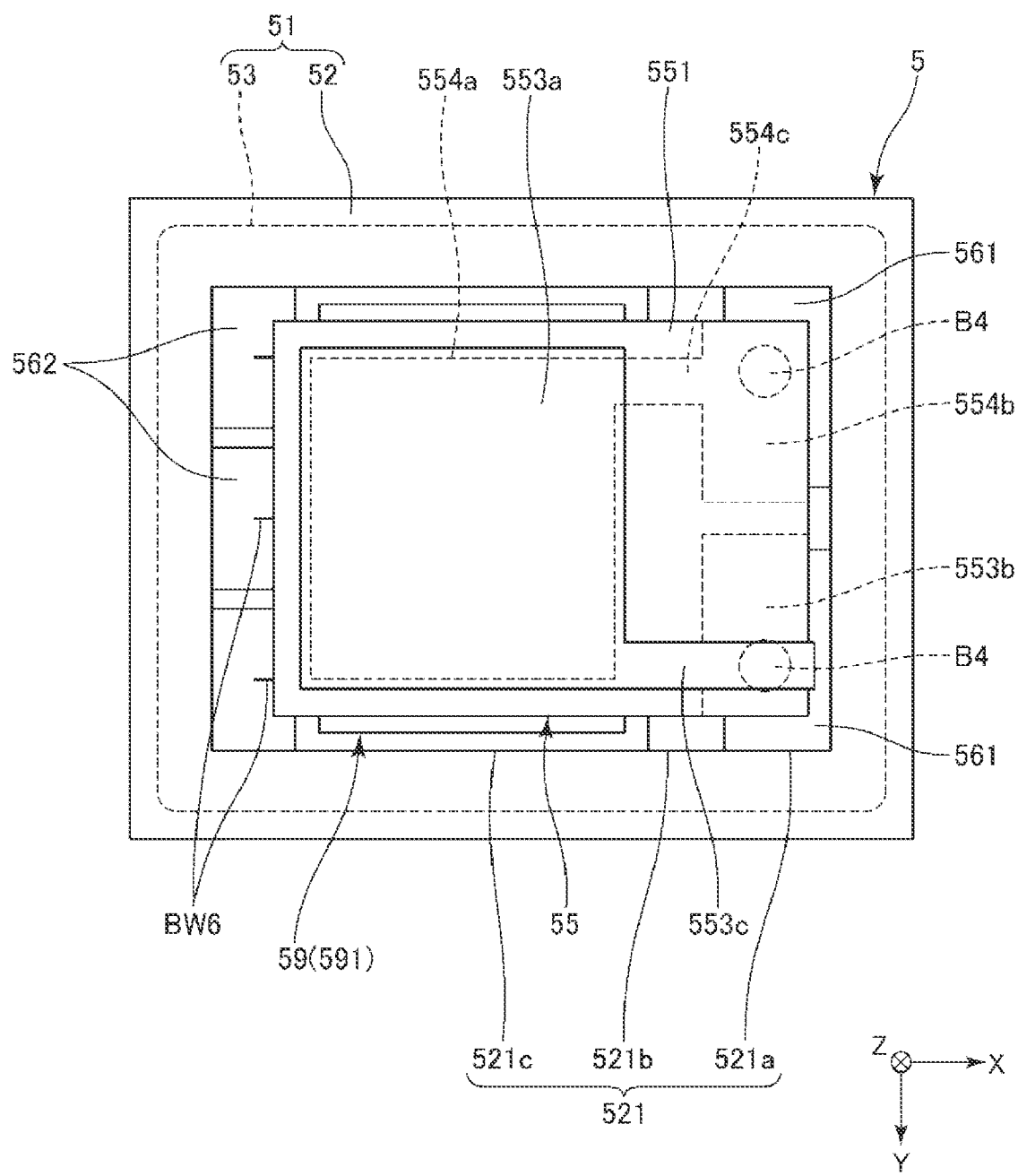
FIG. 6 is a plan view of the voltage-controlled crystal oscillator viewed from a lower surface side.
Figure 7:
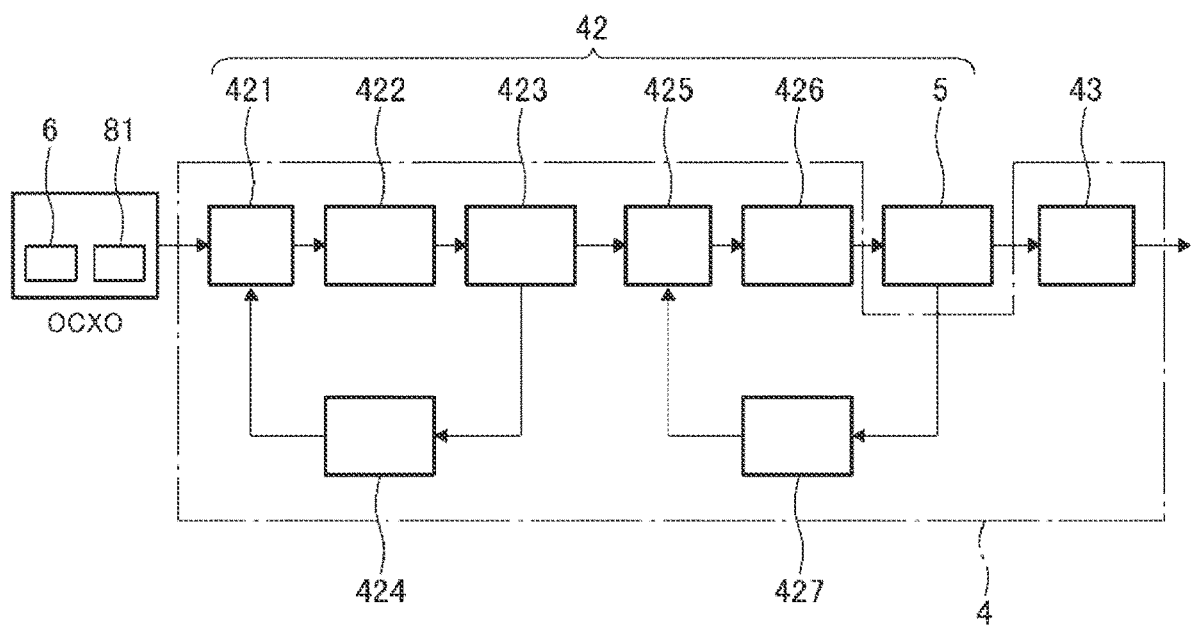
FIG. 7 is a circuit diagram showing a PLL circuit included in a first circuit element provided to the oscillator.
Figure 8:
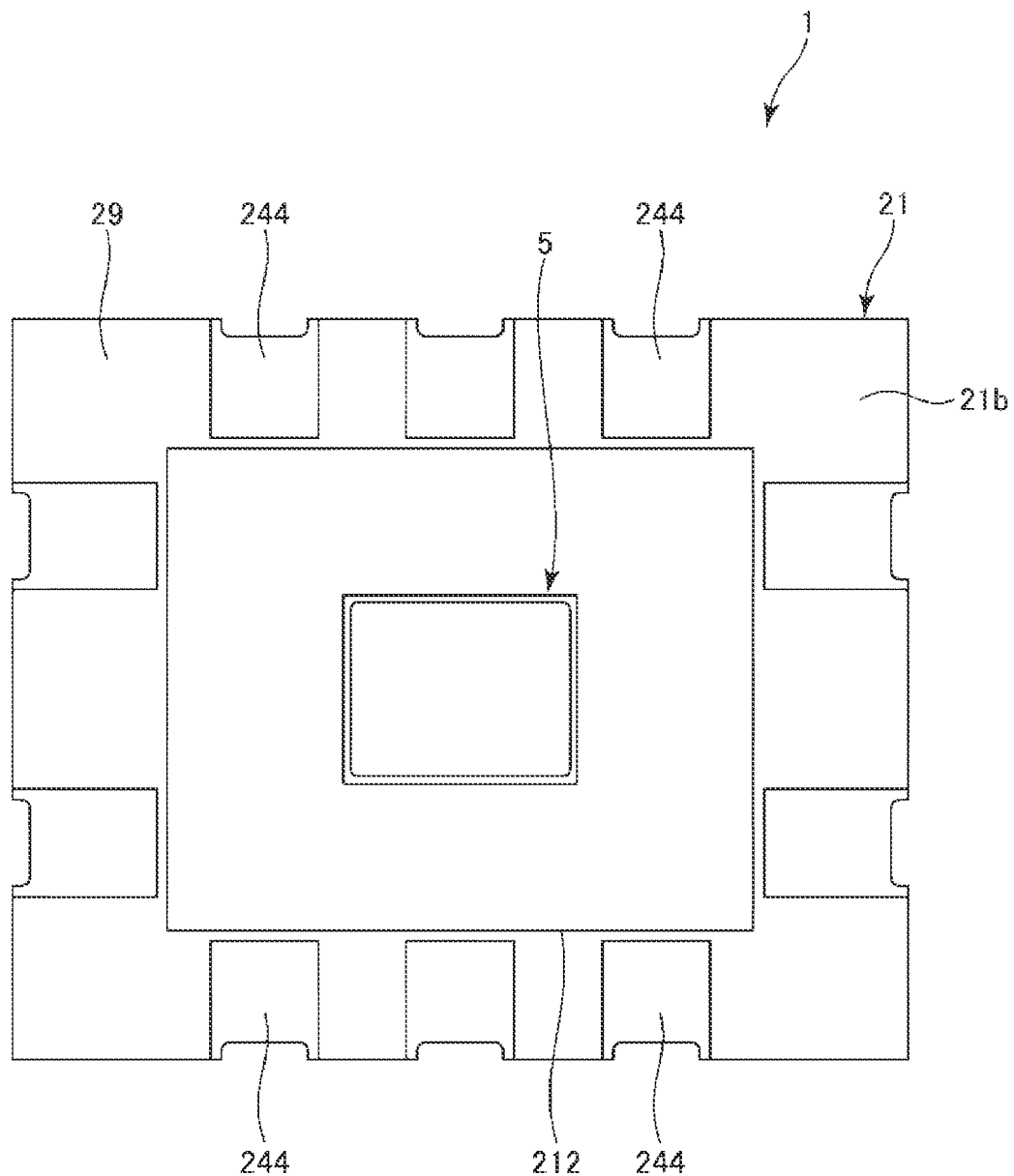
FIG. 8 is a plan view of the oscillator viewed from a lower surface side.
Figure 8:
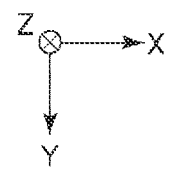

FIG. 1 is a cross-sectional view showing an oscillator according to a first embodiment. FIG. 2 is a plan view of the oscillator viewed from an upper surface side. FIG. 3 is a cross-sectional view showing an inner package provided to the oscillator, and an inside of the inner package. FIG. 4 is a plan view of the inner package viewed from a lower surface side. FIG. 5 is a cross-sectional view showing a voltage-controlled crystal oscillator provided to the oscillator. FIG. 6 is a plan view of the voltage-controlled crystal oscillator viewed from a lower surface side. FIG. 7 is a circuit diagram showing a PLL circuit included in a first circuit element provided to the oscillator. FIG. 8 is a plan view of the oscillator viewed from a lower surface side.

The oscillator 1 shown in FIG. 1 and FIG. 2 has a resonator element 6 as a first resonator element which is an oven-controlled crystal oscillator (OCXO), a second circuit element 8 as a circuit element, a temperature control element 7 as a heater, an inner package 3 as a second package for housing the resonator element 6, the second circuit element 8, and the temperature control element 7, a first circuit element 4, an outer package 2 as a first package for housing the inner package 3 and the first circuit element 4, and a voltage-controlled crystal oscillator 5 which is disposed in the outer package 2, and is provided with a resonator element 55 as a second resonator element. Hereinafter, each of these constituents will sequentially be described.

Outer Package 2

As shown in FIG. 1, the outer package 2 has an outer base 21 and an outer lid 22. The outer base 21 has a box-like shape, and has an upper recessed part 211 opening on an upper surface 21a, and a lower recessed part 212 opening on a lower surface 21b. Therefore, the outer base 21 has a substantially H shape in a longitudinal cross-sectional view. Regarding the outer base 21, in other words, it can be said that the outer base 21 has a substrate 27, a wall part 28 shaped like a frame erected upward from an edge portion of an upper surface of the substrate 27, and a leg part 29 shaped like a frame erected downward from an edge portion of a lower surface of the substrate 27.

Further, the outer lid 22 is shaped like a plate, and is bonded to the upper surface 21a of the outer base 21 via a sealing member 23 such as a seal ring or low-melting-point glass so as to close the opening of the upper recessed part 211. Thus, the upper recessed part 211 is airtightly sealed, and thus, an outer housing space S2 as a housing space is formed inside the outer package 2. Meanwhile, the opening of the lower recessed part 212 is not sealed, but is exposed on the outside of the outer package 2. Further, the inner package 3 and the first circuit element 4 are housed in the outer housing space S2, and the voltage-controlled crystal oscillator 5 is disposed in the lower recessed part 212.

It should be noted that constituent materials of the outer base 21 and the outer lid 22 are each not particularly limited, but it is possible to form the outer base 21 from a variety of ceramic materials such as alumina or titania, and form the outer lid 22 from a variety of metal materials such as Kovar. Thus, the outer package 2 is made tough, and excellent in mechanical strength. Further, it is possible to make the both components approximately equal in linear expansion coefficient, and it is also possible to achieve reduction in thermal stress caused in the outer package 2. Therefore, it becomes difficult for the stress to be applied to the resonator elements 6, 55, and thus, the vibration characteristics of the resonator elements 6, 55 stabilize.

In the detailed description of the outer housing space S2, the upper recessed part 211 has a first upper recessed part 211a opening on the upper surface 21a, a second upper recessed part 211b which opens on a bottom surface of the first upper recessed part 211a, and is smaller in opening than the first upper recessed part 211a, and a third upper recessed part 211c which opens on a bottom surface of the second upper recessed part 211b, and is smaller in opening than the second upper recessed part 211b. Further, the first circuit element 4 is disposed on the bottom surface of the first upper recessed part 211a, and the inner package 3 is disposed on a bottom surface of the third upper recessed part 211c.

The outer housing space S2 is made airtight, and is set in a reduced-pressure state, and more preferably, in a state approximate to a vacuum state. Thus, a thermal insulating property of the outer package 2 is enhanced, and thus, the oscillator 1 is made difficult to be affected by ambient temperature. Further, the heat of the temperature control element 7 becomes difficult to be released, and thus, a heating efficiency of the resonator element 6 increases. Therefore, the temperature of the resonator element 6 further stabilizes, and it is possible to achieve power saving. It should be noted that the atmosphere in the outer housing space S2 is not particularly limited.

Further, the outer base 21 is provided with a plurality of internal terminals 241 arranged on the bottom surface of the first upper recessed part 211a, a plurality of internal terminals 242 arranged on the bottom surface of the second upper recessed part 211b, a plurality of internal terminals 243 arranged on a bottom surface of the lower recessed part 212, and a plurality of external terminals 244 arranged on the bottom surface 21b, namely a top surface of the leg part 29. Each of the internal terminals 241 is electrically coupled to the first circuit element 4 via a bonding wire BW1, each of the internal terminals 242 is electrically coupled to the inner package 3 via a bonding wire BW2, and each of the internal terminals 243 is electrically coupled to the voltage-controlled crystal oscillator 5 via a bonding member B1 having electrical conductivity.

Further, these terminals 241, 242, 243, and 244 are electrically coupled as needed via interconnections 25 formed inside the outer base 21, and thus, electrically couple the first circuit element 4, the inner package 3, the voltage-controlled crystal oscillator 5, and the external terminals 244 to each other. Such an oscillator 1 is coupled to an external device 100 in the external terminals 244. In particular, in the present embodiment, side surface terminals 245 coupled to the external terminals 244 are arranged on a side surface of the leg part 29. The side surface terminals 245 are each a castellation. Therefore, solder H spreads wetting the side surface terminal 245 to form a fillet to make the mechanical and electrical bonding to the external device 100 stronger. It should be noted that this is not a limitation, and, for example, the side surface terminals 245 can be omitted.

Further, the interconnections 25 are coupled to the external terminals 24 passing through the inside of the leg part 29. By forming the interconnections 25 in such a manner so as not to be exposed on the outside of the outer package 2, the oscillator 1 is made difficult to be affected by a disturbance such as a radiation noise or an electromagnetic field. Therefore, it is possible for the oscillator 1 to exert an excellent phase noise characteristic. It should be noted that this is not a limitation, and it is possible for the interconnections 25 to partially be exposed on the outside of the outer package 2.

Inner Package 3

As shown in FIG. 1, the inner package 3 is housed in the outer housing place S2 of the outer package 2. As shown in FIG. 3, the inner package 3 has an inner base 31 and an inner lid 32. The inner base 31 has a box-like shape, and has a recessed part 311 opening on a lower surface 31b. Further, the inner lid 32 is shaped like a plate, and is bonded to the lower surface 31b of the inner base 31 via a sealing member 33 such as a seal ring or low-melting-point glass so as to close the opening of the recessed part 311. Thus, the recessed part 311 is airtightly sealed, and thus, an inner housing space S3 is formed inside the inner package 3. Further, in the inner housing space S3, there are housed the resonator element 6, the temperature control element 7, and the second circuit element 8.

It should be noted that constituent materials of the inner base 31 and the inner lid 32 are each not particularly limited, but it is possible to form the inner base 31 from a variety of ceramic materials such as alumina or titania, and form the inner lid 32 from a variety of metal materials such as Kovar. Thus, the inner package 3 is made tough, and excellent in mechanical strength. Further, it is possible to make the both components approximately equal in linear expansion coefficient, and it is also possible to achieve reduction in thermal stress caused in the inner package 3. Therefore, it becomes difficult for the stress to be applied to the resonator element 6, and thus, the vibration characteristic of the resonator elements 6 stabilizes.

In the detailed description of the inner housing space S3, the recessed part 311 has a first recessed part 311*a* opening on the lower surface 31*b*, a second recessed part 311*b* which opens on a bottom surface of the first recessed part 311*a*, and is smaller in opening than the first recessed part 311*a*, and a third recessed part 311*c* which opens on a bottom surface of the second recessed part 311*b*, and is smaller in opening than the second recessed part 311*b*. Further, the resonator element 6 is disposed on the bottom surface of the first recessed part 311*a*, and the temperature control element 7 and the second circuit element 8 are arranged side by side in the X-axis direction on a bottom surface of the third recessed part 311*c*.

Such an inner housing space S3 is made airtight, and is set in a reduced-pressure state, and more preferably, in a state approximate to a vacuum state. Thus, a viscosity resistance in the inner housing space S3 decreases, and a vibration characteristic of the resonator element 6 is improved. It should be noted that the atmosphere in the inner housing space S3 is not particularly limited.

Further, in the inner base 31, there are arranged a plurality of internal terminals 341 disposed on the bottom surface of the first recessed part 311*a*, a plurality of internal terminals 342 disposed on the bottom surface of the second recessed part 311*b*, and a plurality of external terminals 344 disposed on the upper surface 31*a* of the inner base 31. Each of the internal terminals 341 is electrically coupled to the resonator element 6 via a bonding member B2 having electrical conductivity and a bonding wire BW3, each of the internal terminals 342 is electrically coupled to the temperature control element 7 via a bonding wire BW4, and each of the internal terminals 343 is electrically coupled to the second circuit element 8 via a bonding wire BW5.

Further, these terminals 341, 342, 343, and 344 are electrically coupled to each other as needed via interconnections not shown formed in the inner package 3 to thereby electrically couple the resonator element 6, the temperature control element 7, the second circuit element 8, and the external terminals 344 to each other. In such an inner package 3, the inside and the outside thereof are electrically coupled to each other via the external terminals 344.

Such an inner package 3 as described above is fixed to the bottom surface of the third upper recessed part 211*c* via a bonding member B3 sufficiently low in thermal conductivity in the inner lid 32. It should be noted that the bonding member B3 is not particularly limited, and there can be used, for example, a variety of resin materials having an insulating property such as silicone resin or epoxy resin. By using the material having the insulating property, it is possible to make the thermal conductivity of the bonding member B3 sufficiently low with a simple configuration.

According to such a configuration, since the inner package 3 and the outer package 2 are thermally insulated from each other by the bonding member B3, it becomes difficult for the heat of the temperature control element 7 to be released to the outside via the outer package 2. Therefore, it is possible to stably and efficiently heat the resonator element 6 with the temperature control element 7. In particular, in the present embodiment, the inner lid 32 is fixed to the bottom surface of the third upper recessed part 211*c*. Therefore, it is possible to ensure a long thermal conduction distance between a fixation section to the third upper recessed part 211*c* and the temperature control element 7, and thus, it becomes more difficult for the heat of the temperature control element 7 to be released to the outside via the outer package 2. It should be noted that the fixation method of the inner package 3 to the outer package 2 is not particularly limited.

Resonator Element 6

The resonator element 6 is an SC-cut quartz crystal resonator element. As shown in FIG. 4, the resonator element 6 has a quartz crystal substrate 61 which is cut out as an SC-cut element and has a rectangular planar shape, an excitation electrode 621 arranged in a central portion of an upper surface, a pad electrode 622 which is extracted from the excitation electrode 621, and is arranged in an edge portion of the upper surface, an excitation electrode 631 arranged in a central portion of a lower surface so as to be opposed to the excitation electrode 621, and a pad electrode 632 which is extracted from the excitation electrode 631, and is arranged in an edge portion of the lower surface.

The resonator element 6 is hereinabove described, but the configuration thereof is not particularly limited. For example, a planar shape of the quartz crystal substrate 61 is not limited to the rectangular shape, and can also be a circular shape, an elliptical shape, a semicircular shape, or other polygonal shapes. Further, it is also possible to perform a bevel treatment for grinding an outer edge portion of the quartz crystal substrate 61, or a convex treatment for changing the upper surface and the lower surface of the quartz crystal substrate 61 to convex surfaces. Further, as the resonator element 6, there can be used a piezoelectric resonator element such as an AT-cut quartz crystal resonator element, a BT-cut quartz crystal resonator element, a tuning-fork quartz crystal resonator element, or a surface acoustic wave resonator, an MEMS resonator element, or the like instead of the SC-cut quartz crystal resonator element.

Such a resonator element 6 is fixed to the bottom surface of the first recessed part 311*a* via the bonding member B2 in the end portion thereof. Further, the pad electrodes 622, 623 and the internal terminals 341 are electrically coupled to each other via the bonding member B2 and the bonding wires BW3. It should be noted that a fixation method and the electrical coupling method of the resonator element 6 are not particularly limited. For example, it is possible to adopt a configuration in which the two pad electrodes electrically coupled to the excitation electrode 621 and the excitation electrode 631, respectively, are disposed on the upper surface, and the two pad electrodes are fixed to the bottom surface of the first recessed part 311*a* via a bonding member.

Temperature Control Element 7

As shown in FIG. 3, the temperature control element 7 has a temperature sensor 71 and a heat generation circuit 72. The temperature sensor 71 functions as a temperature detection section for detecting the ambient temperature, in particular, the temperature of the resonator element 6, and the heat generation circuit 72 functions as a heat generation section for heating the resonator element 6. Such a temperature control element 7 is arranged on the bottom surface of the third recessed part 311*c* with an active surface facing downward (toward the inner lid 32 side), and is electrically coupled to the plurality of internal terminals 342 via the bonding wires BW4. In the present embodiment, since the resonator element 6 and the temperature control element 7 are housed in the same space, a difference between the detection result by the temperature sensor 71 and the actual temperature of the resonator element 6 becomes small, and thus, the oscillator 1 excellent in frequency temperature characteristic can be obtained. It should be noted that the heat generation circuit 72 is not necessarily required to be controlled based on the detection result by the temperature sensor 71. For example, it is possible to adopt a configuration in which another temperature sensor is disposed in the second circuit element 8 described later, and the heat generation circuit 72 is controlled based on the detection result by the that temperature sensor.

Second Circuit Element 8

As shown in FIG. 3, the second circuit element 8 has an oscillation circuit 81 for oscillating the resonator element 6. The oscillation circuit 81 is a circuit for amplifying a signal output from the resonator element 6 and then feed the result back to the resonator element 6 to thereby oscillate the resonator element 6 to generate an oscillation signal. Such a second circuit element 8 is arranged on the bottom surface of the third recessed part 311c with an active surface facing downward (toward the inner lid 32 side), and is electrically coupled to the plurality of internal terminals 343 via the bonding wires BW5.

Voltage-Controlled Crystal Oscillator 5

The voltage-controlled crystal oscillator 5 is an oscillator included in a PLL circuit 42 described later. As shown in FIG. 5, the voltage-controlled crystal oscillator 5 has a package 51, and the resonator element 55 and a circuit element 59 housed in the package 51.

The package 51 has a base 52 and a lid 53. The base 52 has a box-like shape, and has a recessed part 521 opening on a lower surface 52b. Further, the lid 53 is shaped like a plate, and is bonded to the lower surface 52b of the base 52 via a sealing member 54 such as a seal ring or low-melting-point glass so as to close the opening of the recessed part 521. Thus, the recessed part 521 is airtightly sealed, and thus, a housing space S5 is formed inside the package 51. Further, the resonator element 55 and the circuit element 59 are housed in the housing space S5.

It should be noted that constituent materials of the base 52 and the lid 53 are each not particularly limited, but it is possible to form the base 52 from a variety of ceramic materials such as alumina or titania, and form the lid 53 from a variety of metal materials such as Kovar. Thus, the package 51 is made tough, and excellent in mechanical strength. Further, it is possible to make the both components approximately equal in linear expansion coefficient, and it is also possible to achieve reduction in thermal stress caused in the package 51. Therefore, it becomes difficult for the stress to be applied to the resonator element 55, and thus, the vibration characteristic of the resonator elements 55 stabilizes.

In the detailed description of the housing space S5, the recessed part 521 has a first recessed part 521a opening on the lower surface 52b, a second recessed part 521b which opens on a bottom surface of the first recessed part 521a, and is smaller in opening than the first recessed part 521a, and a third recessed part 521c which opens on a bottom surface of the second recessed part 521b, and is smaller in opening than the second recessed part 521b. Further, the resonator element 55 is arranged on the bottom surface of the first recessed part 521a, and the circuit element 59 is arranged on a bottom surface of the third recessed part 521c. The housing space S5 is made airtight, and is set in a reduced-pressure state, and more preferably, in a state approximate to a vacuum state. Thus, a viscosity resistance in the housing space S5 decreases, and a vibration characteristic of the resonator element 55 is improved. It should be noted that the atmosphere in the housing space S5 is not particularly limited.

Further, in the base 52, there are arranged a plurality of internal terminals 561 disposed on the bottom surface of the first recessed part 521a, a plurality of internal terminals 562 disposed on the bottom surface of the second recessed part 521b, and a plurality of external terminals 564 disposed on the upper surface 52a of the base 52. Further, the internal terminals 561 are electrically coupled to the resonator element 55 via bonding members B4 having electrical conductivity, and the internal terminals 562 are electrically coupled to the circuit element 59 via bonding wires BW6. These terminals 561, 562, and 564 are electrically coupled to each other as needed via interconnections not shown formed in the base 52 to thereby electrically couple the resonator element 55, the circuit element 59, and the external terminals 564 to each other. In such a package 51, the inside and the outside thereof are electrically coupled to each other via the external terminals 564.

The resonator element 55 is an AT-cut quartz crystal resonator element. As shown in FIG. 6, the resonator element 55 has a quartz crystal substrate 551 having a rectangular shape cut out as an AT-cut element, excitation electrodes 553a, 554a arranged so as to be opposed to each other on the upper and lower surfaces of the quartz crystal substrate 551, pad electrodes 553b, 554b arranged on the upper surface of the quartz crystal substrate 551, and extraction electrodes 553c, 554c for coupling the excitation electrodes 553a, 554a and the pad electrodes 553b, 554b to each other, respectively.

The resonator element 55 is hereinabove described, but the configuration thereof is not particularly limited. For example, a planar shape of the quartz crystal substrate 551 is not limited to the rectangular shape, and can also be a circular shape, a quadrangular shape other than the rectangular shape, or other polygonal shapes. Further, it is also possible to perform a bevel treatment for grinding an outer edge portion of the quartz crystal substrate 551, or a convex treatment for changing the upper surface and the lower surface of the quartz crystal substrate 551 to convex surfaces. Further, as the resonator element 55, there can be used a piezoelectric resonator element such as an SC-cut quartz crystal resonator element, a BT-cut quartz crystal resonator element, a tuning-fork quartz crystal resonator element, or a surface acoustic wave resonator, an MEMS resonator element, or the like instead of the AT-cut quartz crystal resonator element.

Such a resonator element 55 is fixed to the bottom surface of the first recessed part 521a via the pair of bonding members B4 in the end portion thereof. Further, the pad electrodes 553b, 554b and the internal terminals 561 are electrically coupled to each other via the bonding members B4. It should be noted that a fixation method and the electrical coupling method of the resonator element 55 are not particularly limited.

The circuit element 59 has an oscillation circuit 591 for oscillating the resonator element 55. Such a circuit element 59 is arranged on the bottom surface of the third recessed part 521c with an active surface facing downward, and is electrically coupled to the plurality of internal terminals 562 via the bonding wires BW6.

As shown in FIG. 5, such a voltage-controlled crystal oscillator 5 as described above is bonded to the bottom surface of the lower recessed part 212 via the bonding members B1 having electrical conductivity. Further, the external terminals 564 and the internal terminals 243 are electrically coupled to each other via the bonding members B1.

First Circuit Element 4

As shown in FIG. 1, the first circuit element 4 has a temperature controlling circuit 41 for controlling the drive of the temperature control element 7, a part of the PLL circuit 42, and an output buffer circuit 43.

The temperature controlling circuit 41 is a circuit for controlling an amount of the electric current flowing through a resistor of the heat generation circuit 72 based on an output signal of the temperature sensor 71 to keep the temperature of the resonator element 6 constant. For example, the temperature controlling circuit 41 performs control of making a desired electric current flow into the resistor of the heat generation circuit 72 when the current temperature determined from the output signal of the temperature sensor 71 is lower than a reference temperature set in advance, and preventing the electric current flowing into the resistor of the heat generation circuit 72 when the current temperature is higher than the reference temperature. Further, for example, it is possible for the temperature controlling circuit 41 to control the amount of the electric current flowing through the resistor of the heat generation circuit 72 to increase or decrease in accordance with a difference between the current temperature and the reference temperature. Further, as described above, it is possible for the temperature controlling circuit 41 to control the heat generation circuit 72 based on the detection result by a temperature sensor stored in the second circuit element 8.

As shown in FIG. 7, the PLL circuit 42 has a first phase comparator 421 to which a reference frequency signal as an oscillation signal output from the oscillation circuit 81, a first lowpass filter 422, a voltage-controlled oscillator 423 to which a direct-current signal from the first lowpass filter 422 is input, and a first frequency divider 424 to which a frequency signal output from the voltage-controlled oscillator 423 is input. Then, the frequency signal frequency-divided by the first frequency divider 424 is input to the first phase comparator 421. In the first phase comparator 421, a phase difference between the reference frequency signal and the frequency signal is detected, and is then output to the first lowpass filter 422. In the first lowpass filter 422, a high frequency component is removed from the output signal from the first phase comparator 421, and then the result is converted into a voltage and is output as a direct-current signal for controlling the voltage-controlled oscillator 423.

It should be noted that the first frequency divider 424 can set a fractional frequency division ratio by, for example, switching between integer frequency division ratios to achieve the fractional frequency division ratio on average. Thus, the anterior part of the PLL circuit constituted by the first phase comparator 421, the first lowpass filter 422, the voltage-controlled oscillator 423, and the first frequency divider 424 functions as a fractional frequency dividing PLL circuit (a fractional PLL circuit). As a result, in the fractional frequency dividing PLL circuit, it becomes possible to output a signal with an arbitrary frequency.

Further, the PLL circuit 42 has a second phase comparator 425 to which a frequency signal output from the voltage-controlled oscillator 423 is input, a second lowpass filter 426, the voltage-controlled crystal oscillator 5, and a second frequency divider 427 to which a frequency signal output from the voltage-controlled oscillator 5 is input. Then, the frequency signal frequency-divided by the second frequency divider 427 is input to the second phase comparator 425. In the second phase comparator 425, a phase difference between the frequency signal output from the voltage-controlled oscillator 423 and the frequency signal frequency-divided by the second frequency divider 427 is detected, and is then output to the second lowpass filter 426. In the second lowpass filter 426, a high frequency component is removed from the output signal from the second phase comparator 425, and then the result is converted into a voltage and is output as a direct-current signal (a frequency control signal) for controlling the voltage-controlled oscillator 5.

It should be noted that the second frequency divider 427 is, for example, an integer frequency divider for performing the integer frequency division on the signal input to the second frequency divider 427. Thus, the posterior part of the PLL circuit constituted by the second phase comparator 425, the second lowpass filter 426, the voltage-controlled oscillator 5, and the second frequency divider 427 functions as a integer frequency dividing PLL circuit (an integer PLL circuit). In the integer frequency dividing PLL circuit, it is possible to form a circuit relatively low in phase noise, and relatively simple in circuit configuration.

Further, a frequency signal corresponding to the voltage of the direct-current signal is output from the voltage-controlled crystal oscillator 5 toward the output buffer circuit 43. In other words, the oscillation frequency of the voltage-controlled crystal oscillator 5 is controlled based on the reference frequency signal output from the oscillation circuit 81.

Out of the circuit elements constituting the PLL circuit 42, the voltage-controlled oscillator 5 is configured as a separated body from the first circuit element 4, and it is possible for the other elements to be configured as separated bodies from the first circuit element 4. For example, it is possible to configure the first and second lowpass filters 422, 426 as separated bodies from the first circuit element 4, and arrange the first and second lowpass filters 422, 426 in alignment with the voltage-controlled crystal oscillator 5 on the bottom surface of the lower recessed part 212.

Here, as shown in FIG. 8, the voltage-controlled crystal oscillator 5 is disposed on the bottom surface of the lower recessed part 212, and is surrounded by the leg part 29. Therefore, the leg part 29 exerts a function of a windbreak wall to make it difficult to blow a wind to the voltage-controlled crystal oscillator 5. Therefore, the temperature fluctuation of the voltage-controlled crystal oscillator 5 due to the wind is suppressed, and it is possible to effectively prevent the deterioration of the phase noise characteristic of the output signal output from the output buffer circuit 43.

In particular, in the present embodiment, the leg part 29 has a frame-like shape, and surrounds the whole circumference of the voltage-controlled crystal oscillator 5 in the plan view. Therefore, the advantage described above becomes more conspicuous. Further, as shown in FIG. 1, a height H1 of the leg part 29 from the bottom surface of the lower recessed part 212 is larger than a height H2 of the voltage-controlled crystal oscillator 5 from the bottom surface of the lower recessed part 212. Thus, the entire area of the voltage-controlled crystal oscillator 5 is housed inside the lower recessed part 212, and therefore, the advantage described above becomes more conspicuous.

Further, the leg part 29 is formed integrally with the substrate 27. In other words, the leg part 29 is formed as a part of the outer base 21 together with the substrate 27. Therefore, it becomes easy to form the leg part 29.

The oscillator 1 is hereinabove described. As described above, such an oscillator 1 has the resonator element 6 as the first resonator element, the second circuit element 8 as the circuit element for oscillating the resonator element 6 to generate the oscillation signal, the outer package 2 as the first package which is provided with the substrate 27, and which has the outer housing space S2 as the housing space for housing the resonator element 6 and the second circuit element 8 at the upper surface side, namely one principal surface side, of the substrate 27, the resonator element 55 as the second resonator element which is disposed at the lower surface side, namely the other principal surface side, of the substrate 27, and the oscillation frequency of which is controlled based on the oscillation signal, and the leg part 29 which is disposed at the lower surface side of the substrate so as to surround the resonator element 55 in the plan view of the substrate 27. According to such a configuration, the leg part 29 exerts the function of the windbreak wall to suppress the temperature fluctuation of the resonator element 55 due to the wind, and thus, it is possible to effectively prevent the deterioration of the noise characteristic of the output signal.

In particular, in the present embodiment, the leg part 29 is shaped like a frame surrounding the whole circumference of the resonator element 55 in the plan view of the substrate 27. Therefore, the advantage described above becomes more conspicuous. Specifically, it becomes more difficult to blow a wind to the resonator element 55, and thus, the temperature fluctuation of the resonator element 55 due to the wind is further suppressed. Therefore, it is possible to more effectively prevent the deterioration of the noise characteristic of the output signal.

Further, as described above, the oscillator 1 has the external terminals 244 arranged on the lower surface 21b as the top surface of the leg part 29, and the interconnections 25 which are arranged inside the leg part 29 and are electrically coupled to the external terminals 244. As described above, by arranging the external terminals 244 on the top surface of the leg part 29, it becomes easy to couple the oscillator 1 and the external device 100 to each other. Further, by forming the interconnections 25 inside the leg part 29, it becomes difficult to be affected by a disturbance.

Further, as described above, the oscillator 1 has the side surface terminals 245 which are arranged on the side surface of the leg part 29, and are coupled to the external terminals 244. Thus, the side surface terminals 245 function as castellation when coupling the oscillator 1 to the external device 100. Therefore, solder H spreads wetting the side surface terminal 245 to form a fillet to make the bonding to the external device 100 stronger.

Further, as described above, the leg part 29 is formed integrally with the substrate 27. Thus, it becomes easy to form the leg part 29.

Further, as described above, the oscillator 1 has the temperature control element 7 as a heater for heating the resonator element 6. Thus, the temperature of the resonator element 6 stabilizes, and it is possible to exert a more excellent frequency-temperature characteristic.

Further, as described above, the oscillator 1 has the inner package 3 as the second package for housing the resonator element 6 and the temperature control element 7. Further, the inner package 3 is bonded to the substrate 27 (the bottom surface of the third upper recessed part 211c) via the bonding member B3 having the insulating property. Thus, since the inner package 3 and the outer package 2 are thermally insulated from each other by the bonding member B3, it becomes difficult for the heat of the temperature control element 7 to be released to the outside via the outer package 2. Therefore, it is possible to stably and efficiently heat the resonator element 6 with the temperature control element 7.

Second Embodiment

Figure 9:
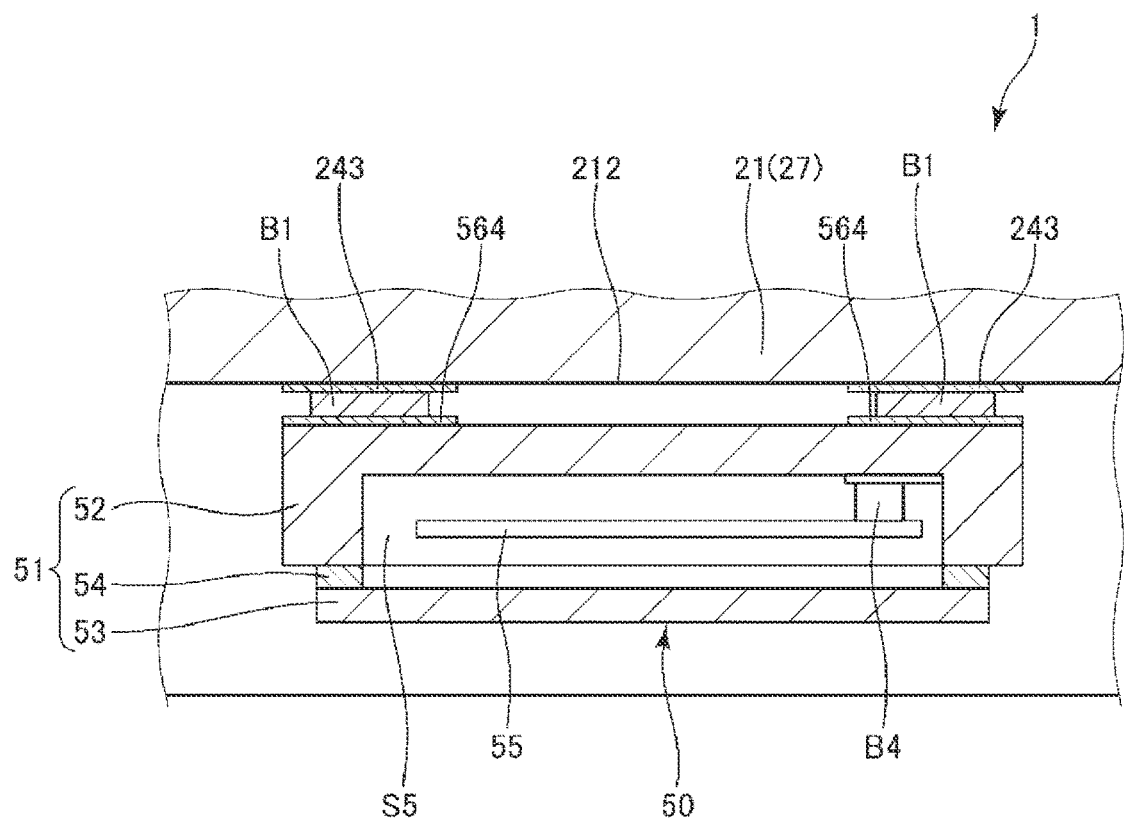
FIG. 9 is a cross-sectional view showing an oscillator according to a second embodiment.
Figure 10:
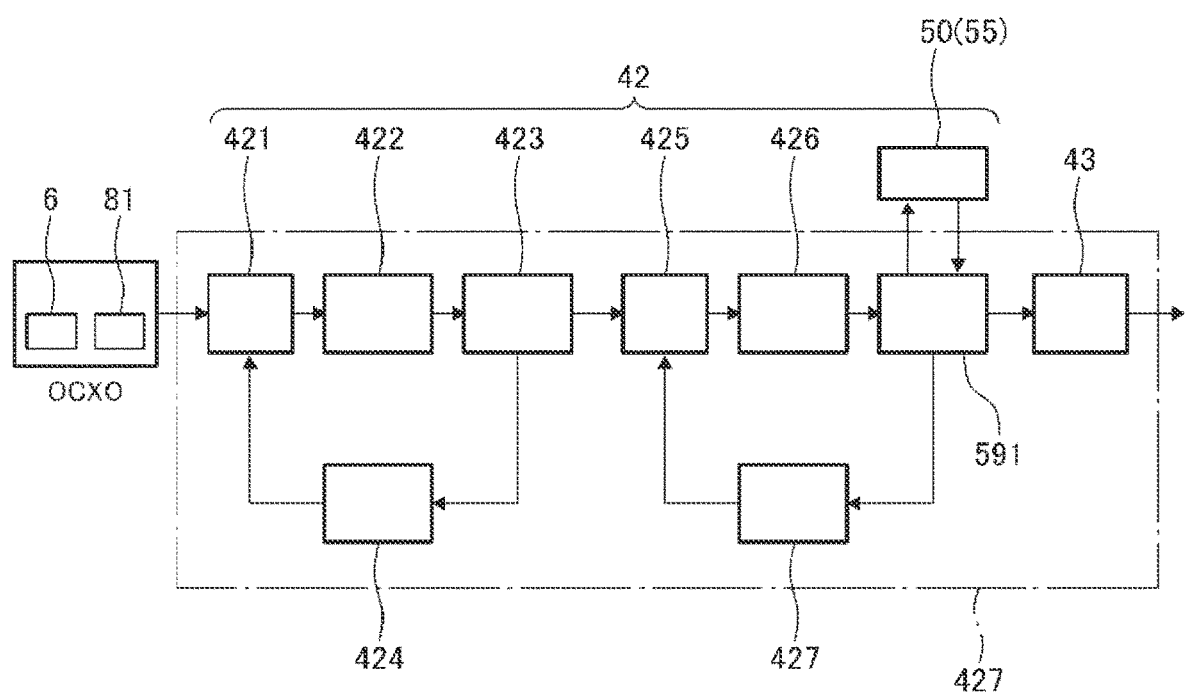
FIG. 10 is a circuit diagram showing a PLL circuit included in a first circuit element provided to the oscillator.

FIG. 9 is a cross-sectional view showing an oscillator according to a second embodiment. FIG. 10 is a circuit diagram showing a PLL circuit included in a first circuit element provided to the oscillator.

The oscillator 1 according to the present embodiment is substantially the same as in the first embodiment described above except the point that a resonator 50 is used instead of the voltage-controlled crystal oscillator 5. Therefore, in the following description, the present embodiment will be described with a focus on the difference from the first embodiment described above, and the description of substantially the same issues will be omitted. Further, in each of the drawings in the present embodiment, the constituents substantially the same as those in the embodiment described above are denoted by the same reference symbols.

As shown in FIG. 9, in the oscillator 1 according to the present embodiment, there is used the resonator 50 having the resonator element 55 housed in the package 51 instead of the voltage-controlled crystal oscillator 5. Further, as shown in FIG. 10, the oscillation circuit 591 for oscillating the resonator element 55 is formed in the first circuit element 4.

According also to such a second embodiment as described hereinabove, substantially the same advantages as in the first embodiment described above can be exerted.

Third Embodiment

Figure 11:
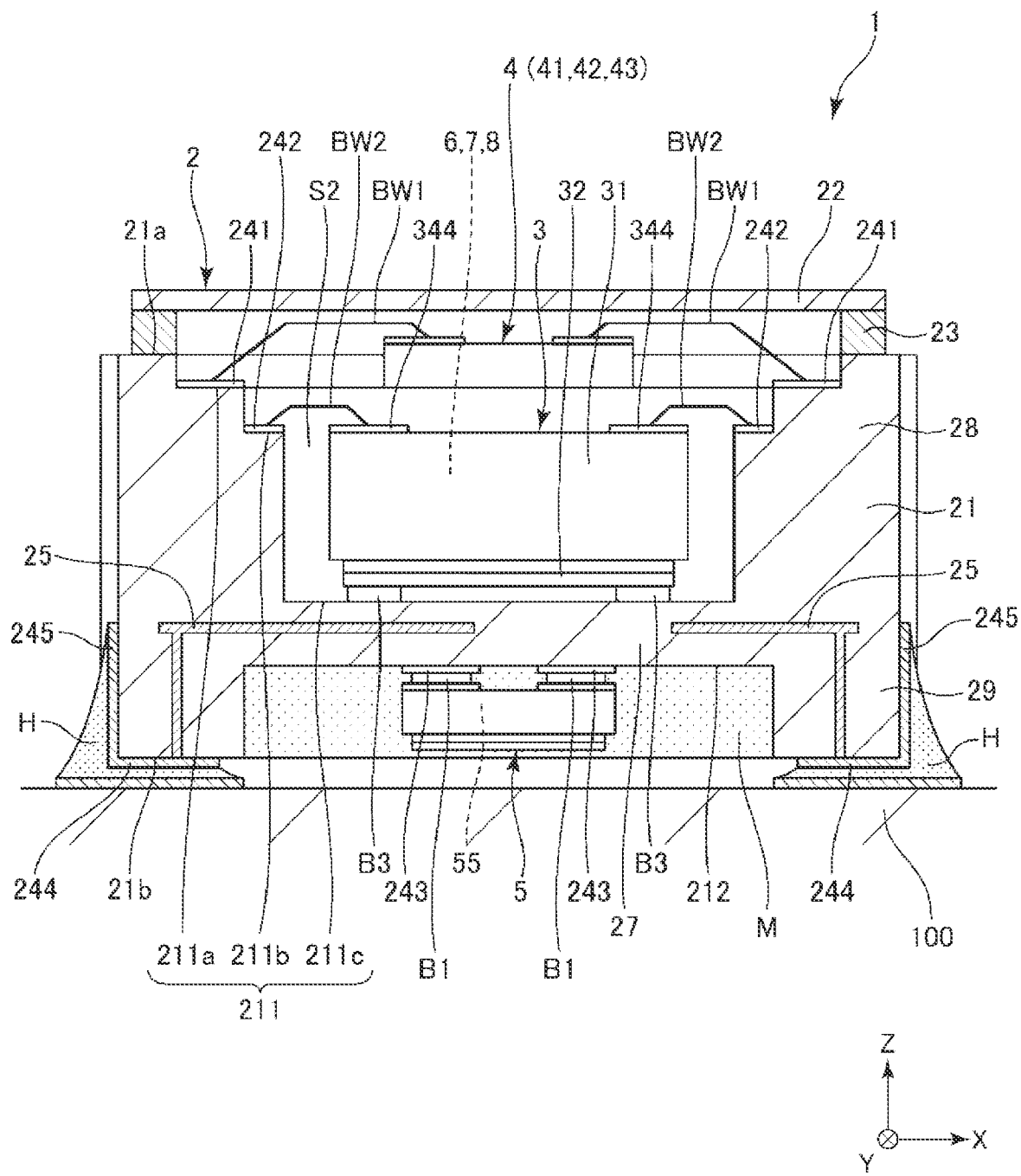
FIG. 11 is a cross-sectional view showing an oscillator according to a third embodiment.

FIG. 11 is a cross-sectional view showing an oscillator according to a third embodiment.

The oscillator 1 according to the present embodiment is substantially the same as in the first embodiment described above except the point that the voltage-controlled crystal oscillator 5 is molded. Therefore, in the following description, the present embodiment will be described with a focus on the difference from the first embodiment described above, and the description of substantially the same issues will be omitted. Further, in the drawings in the present embodiment, the constituents substantially the same as in the embodiments described above are denoted by the same reference symbols.

As shown in FIG. 11, in the oscillator 1 according to the present embodiment, the lower recessed part 212 is filled with a resin material M, and thus, the voltage-controlled crystal oscillator 5 is molded with the resin material M. According to such a configuration, it becomes more difficult for the voltage-controlled crystal oscillator 5 to be affected by the wind.

According also to such a third embodiment as described hereinabove, there can be exerted substantially the same advantages as in the first embodiment described above.

Fourth Embodiment

Figure 12:
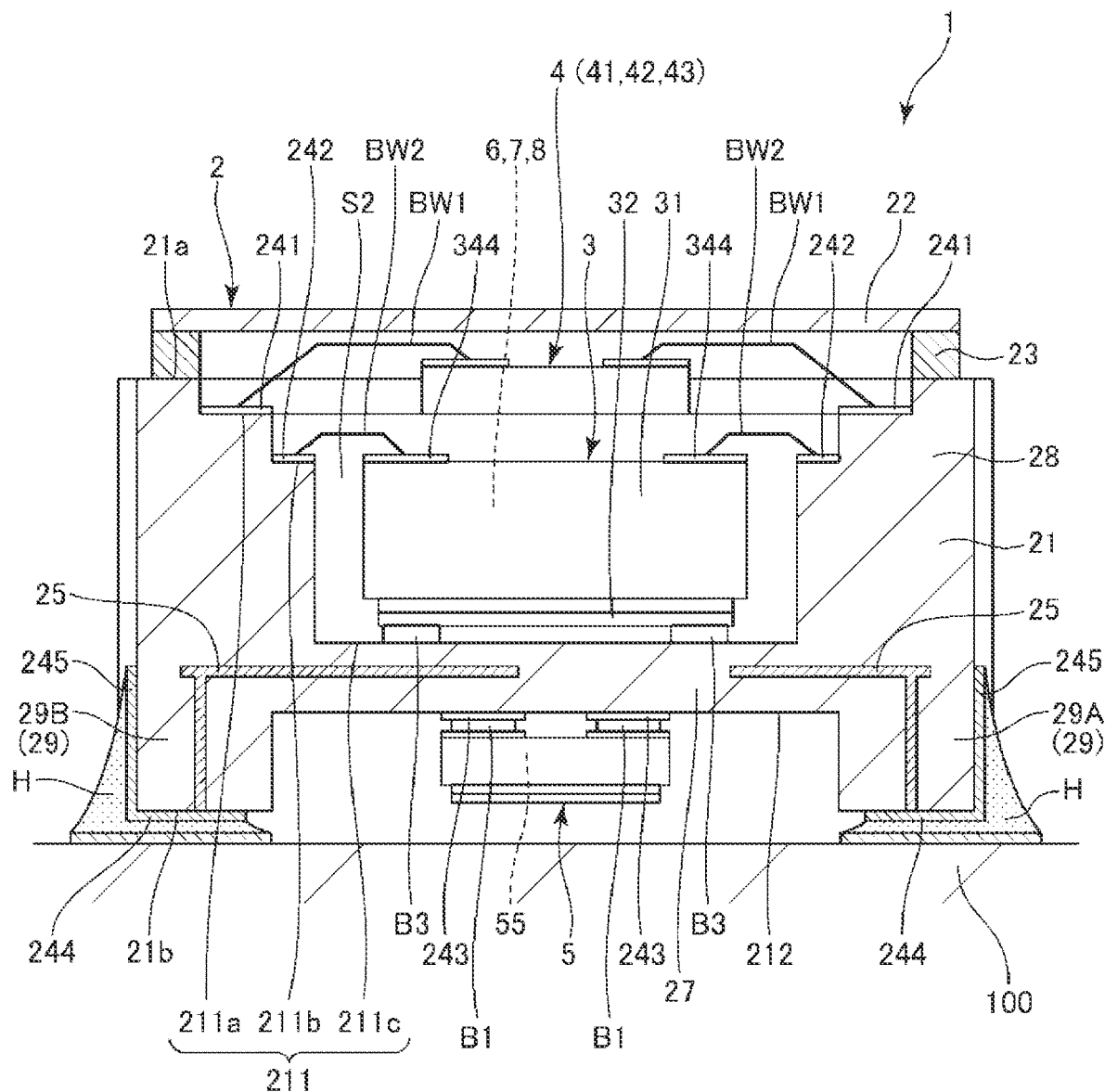
FIG. 12 is a cross-sectional view showing an oscillator according to a fourth embodiment.
Figure 13:
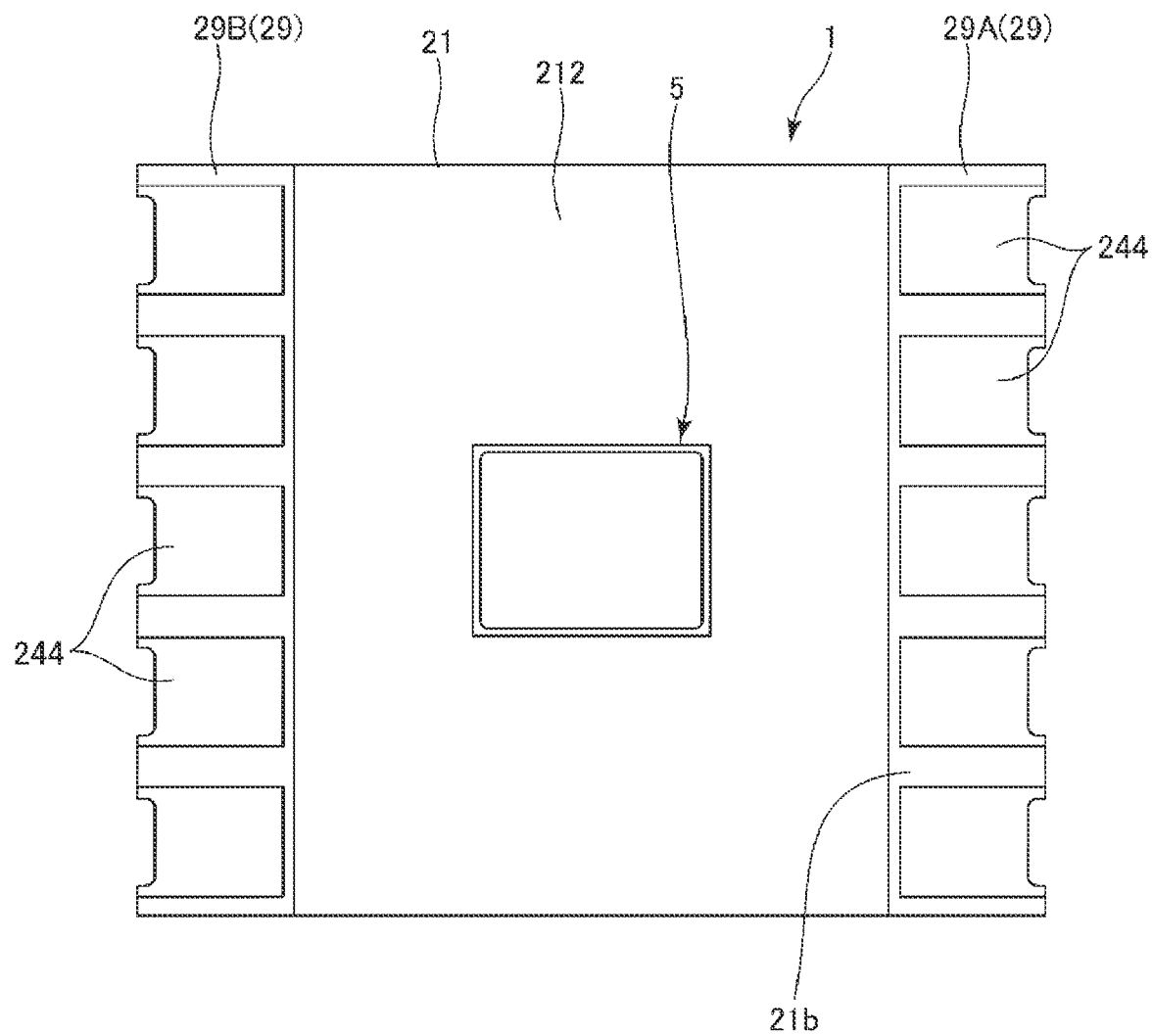
FIG. 13 is a plan view of the oscillator viewed from a lower surface side.
Figure 13:
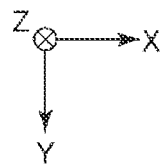

FIG. 12 is a cross-sectional view showing an oscillator according to a fourth embodiment. FIG. 13 is a plan view of the oscillator viewed from a lower surface side.

The oscillator 1 according to the present embodiment is substantially the same as in the first embodiment described above except the point that the configuration of the leg part 29 is different. Therefore, in the following description, the present embodiment will be described with a focus on the difference from the first embodiment described above, and the description of substantially the same issues will be omitted. Further, in each of the drawings in the present embodiment, the constituents substantially the same as those in the embodiments described above are denoted by the same reference symbols.

As shown in FIG. 12 and FIG. 13, in the oscillator 1 according to the present embodiment, the leg part 29 has a pair of unit leg parts 29A, 29B arranged so as to be located across the voltage-controlled crystal oscillator 5. In the illustrated aspect, the unit leg part 29A is located at the positive side in the X-axis direction of the voltage-controlled crystal oscillator 5, and the unit leg part 29B is located at the negative side in the X-axis direction thereof.

Further, the unit leg parts 29A, 29B each extend in the Y-axis direction perpendicular to the X-axis direction as an arrangement direction of these unit leg parts in a plan view of the substrate 27. According to such a configuration, it is possible to prevent the wind from the X-axis direction with the unit leg parts 29A, 29B, and thus, it becomes difficult to blow a wind to the voltage-controlled crystal oscillator 5. Therefore, the temperature fluctuation of the voltage-controlled crystal oscillator 5 due to the wind is suppressed, and it is possible to effectively prevent the deterioration of the noise characteristic of the output signal.

As described above, in the oscillator 1 according to the present embodiment, the leg part 29 has the pair of unit leg parts 29A, 29B arranged so as to be located across the resonator element 55, and the pair of unit leg parts 29A, 29B each extend in the Y-axis direction perpendicular to the X-axis direction as the arrangement direction of the pair of unit leg parts 29A, 29B in the plan view of the substrate 27. According to such a configuration, it is possible to prevent the wind from the X-axis direction with the unit leg parts 29A, 29B, and thus, the temperature fluctuation of the resonator element 55 due to the wind is prevented. Therefore, it is possible to effectively prevent the deterioration of the noise characteristic of the output signal.

According also to such a fourth embodiment as described hereinabove, there can be exerted substantially the same advantages as in the first embodiment described above.

Fifth Embodiment

Figure 14:
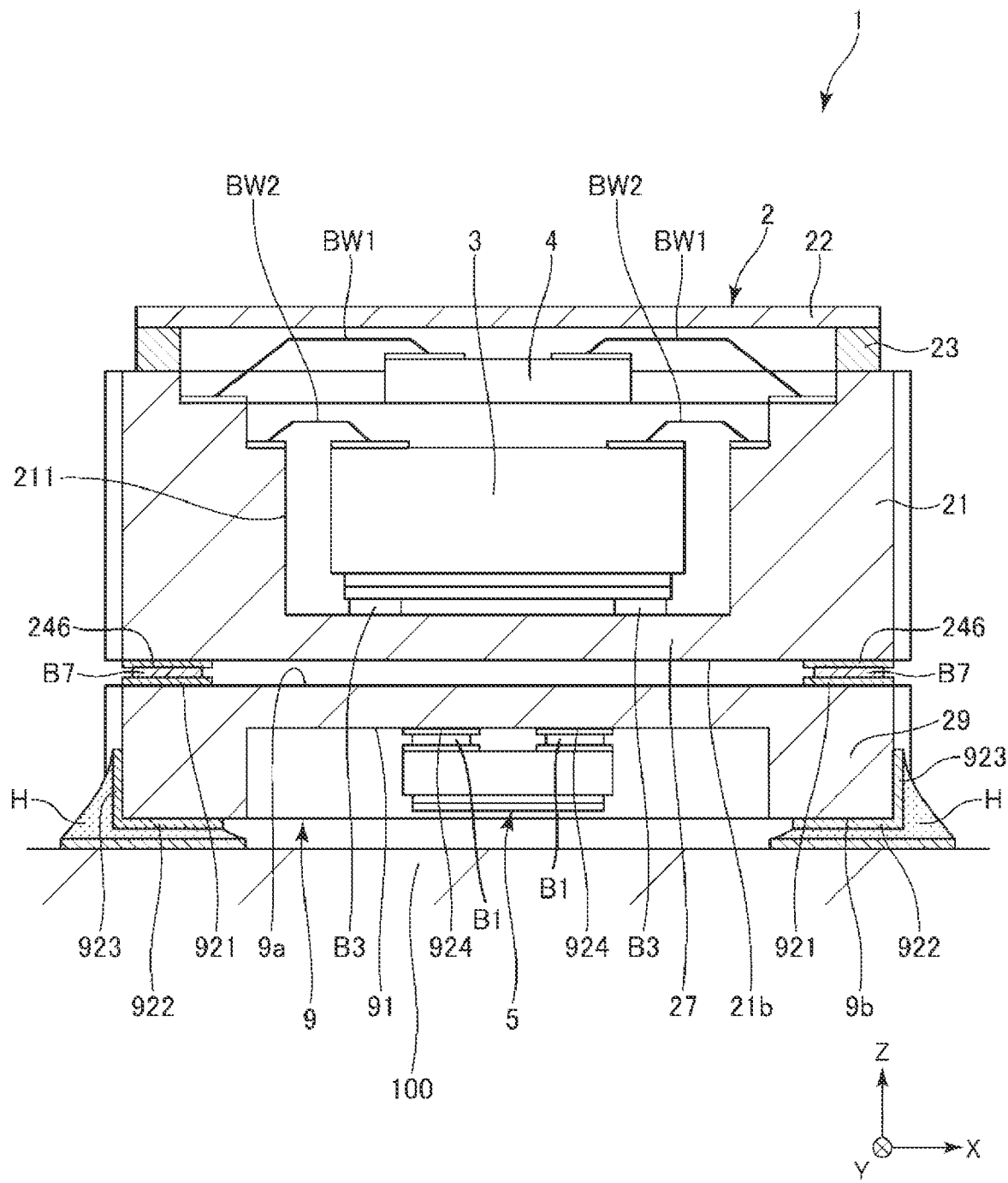
FIG. 14 is a cross-sectional view showing an oscillator according to a fifth embodiment.
Figure 15:
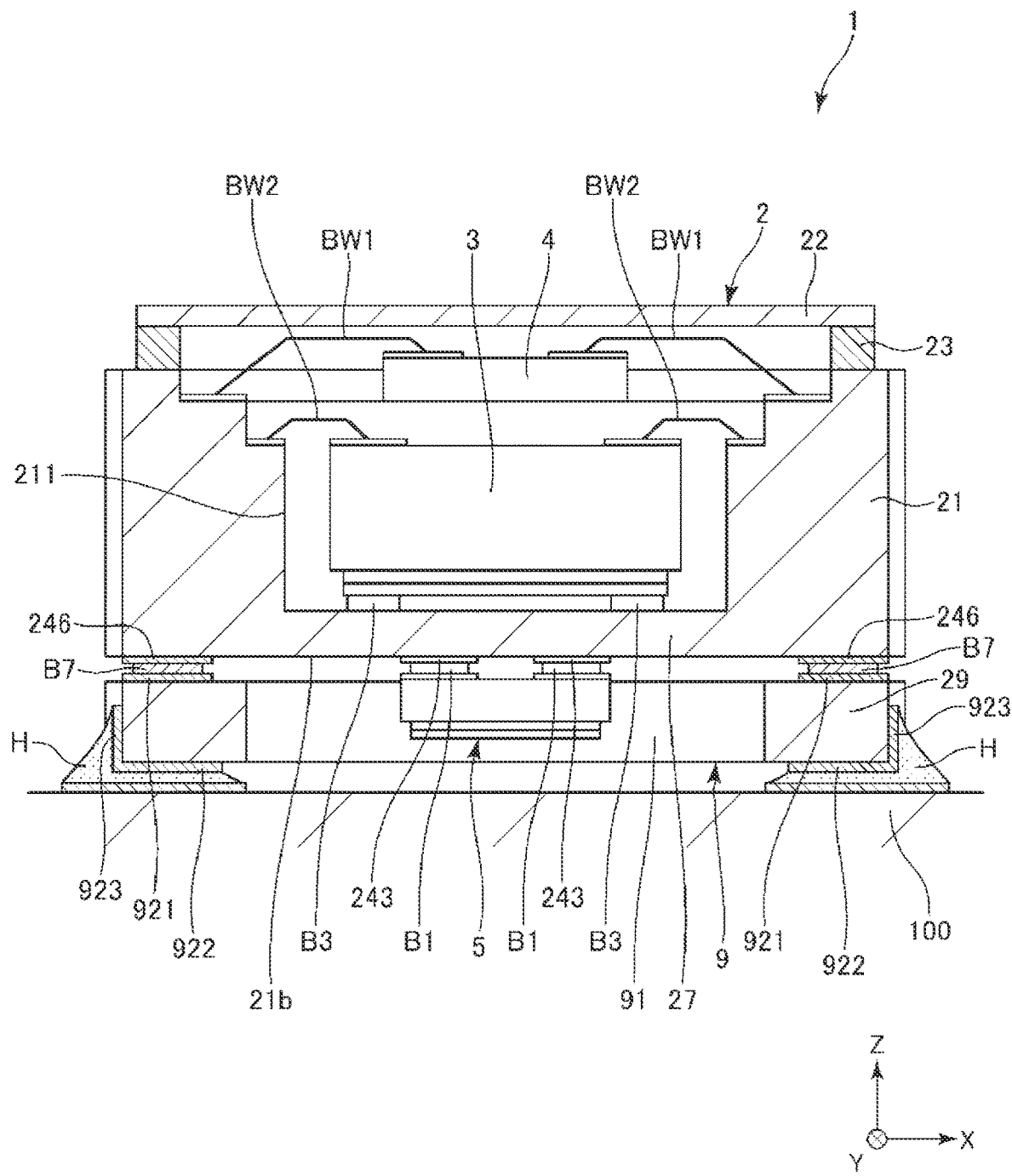
FIG. 15 is a cross-sectional view showing a modified example of the oscillator shown in FIG. 14.

FIG. 14 is a cross-sectional view showing an oscillator according to a fifth embodiment. FIG. 15 is a cross-sectional view showing a modified example of the oscillator shown in FIG. 14.

The oscillator 1 according to the present embodiment is substantially the same as in the first embodiment described above except the point that the leg part 29 is formed of a separated body from the outer package 2. Therefore, in the following description, the present embodiment will be described with a focus on the difference from the first embodiment described above, and the description of substantially the same issues will be omitted. Further, in each of the drawings in the present embodiment, the constituents substantially the same as those in the embodiments described above are denoted by the same reference symbols.

As shown in FIG. 14, in the oscillator 1 according to the present embodiment, the leg part 29 and the outer package 2 are formed separately from each other. Thus, the design freedom of the shape, the material, and so on of the leg part 29 increases, and the leg part 29 is made capable of exerting a more excellent windbreak effect.

Such an oscillator 1 has a leg part substrate 9 which is arranged at a lower side of the outer package 2, and is provided with the leg part 29. The lower recessed part 212 is omitted from the outer package 2, and the lower surface of the substrate 27 forms the lower surface 21b of the outer base 21. Further, on the lower surface 21b, there is arranged a plurality of coupling terminals 246 electrically coupled to the constituents in the outer package 2.

Meanwhile, the leg part substrate 9 has a recessed part 91 opening on a lower surface 9b thereof, and thus, there is formed the leg part 29 shaped like a frame erected on the periphery of the recessed part 91. Further, on a bottom surface of the recessed part 91, there is arranged the voltage-controlled crystal oscillator 5. Further, on an upper surface 9a of the leg part substrate 9, there is arranged a plurality of coupling terminals 921, on the bottom surface of the recessed part 91, there is arranged a plurality of internal terminals 924 electrically coupled to the voltage-controlled crystal oscillator 5, and on a lower surface 9b of the leg part substrate 9, namely the top surface of the leg part 29, there is arranged a plurality of external terminals 922. These terminals 921, 922, and 924 are coupled via interconnections not shown formed inside the leg part substrate 9. Further, on a side surface of the leg part 29, there is arranged a plurality of side surface terminals 923 coupled to the external terminals 922.

It should be noted that the constituent material of the leg part substrate 9 is not particularly limited, and can be, for example, a ceramic material substantially the same as that of the outer base 21. Thus, the leg part substrate 9 is made tough, and excellent in mechanical strength. Further, it is possible to make the both components approximately equal in linear expansion coefficient, and it is also possible to achieve reduction in thermal stress. Therefore, it becomes difficult for the stress to be applied to the resonator elements 6, 55, and thus, the oscillation characteristics of the resonator elements 6, 55 stabilize. Further, the leg part substrate 9 can be, for example, a printed circuit board (PCB). Thus, it is possible to manufacture the leg part substrate 9 at a lower price.

The outer package 2 and the leg part substrate 9 are bonded to each other via a plurality of bonding members B7 having electrical conductivity. Further, the coupling terminals 246 at the outer package 2 side and the coupling terminals 921 at the leg part substrate 9 side are electrically coupled to each other via the bonding members B7. Such an oscillator 1 is coupled to the external device 100 in the external terminals 922.

According to such a configuration, the lower surface 21b of the outer base 21 and the upper surface 9a of the leg part substrate 9 are each made flat. Therefore, a handling characteristic in the manufacturing process is made excellent, and it becomes easy to manufacture the oscillator 1.

As described above, in the oscillator 1 according to the present embodiment, the leg part 29 is formed as a separated body from the substrate 27. Thus, the design freedom of the shape, the material, and so on of the leg part 29 increases, and the leg part 29 is made capable of exerting a more excellent windbreak effect.

Further, as described above, the leg part 29 can be, for example, a printed circuit board. Thus, it is possible to manufacture the leg part 29 at a lower price.

According also to such a fifth embodiment as described hereinabove, there can be exerted substantially the same advantages as in the first embodiment described above. It should be noted that as a modified example of the present embodiment, as shown in, for example, FIG. 15, it is possible to make the recessed part 91 penetrate to the upper surface 9a, and arrange the voltage-controlled crystal oscillator 5 on the lower surface 21b of the outer base 21. Thus, it is possible to achieve reduction in height of the oscillator 1 compared to the present embodiment.

Sixth Embodiment

Figure 16:
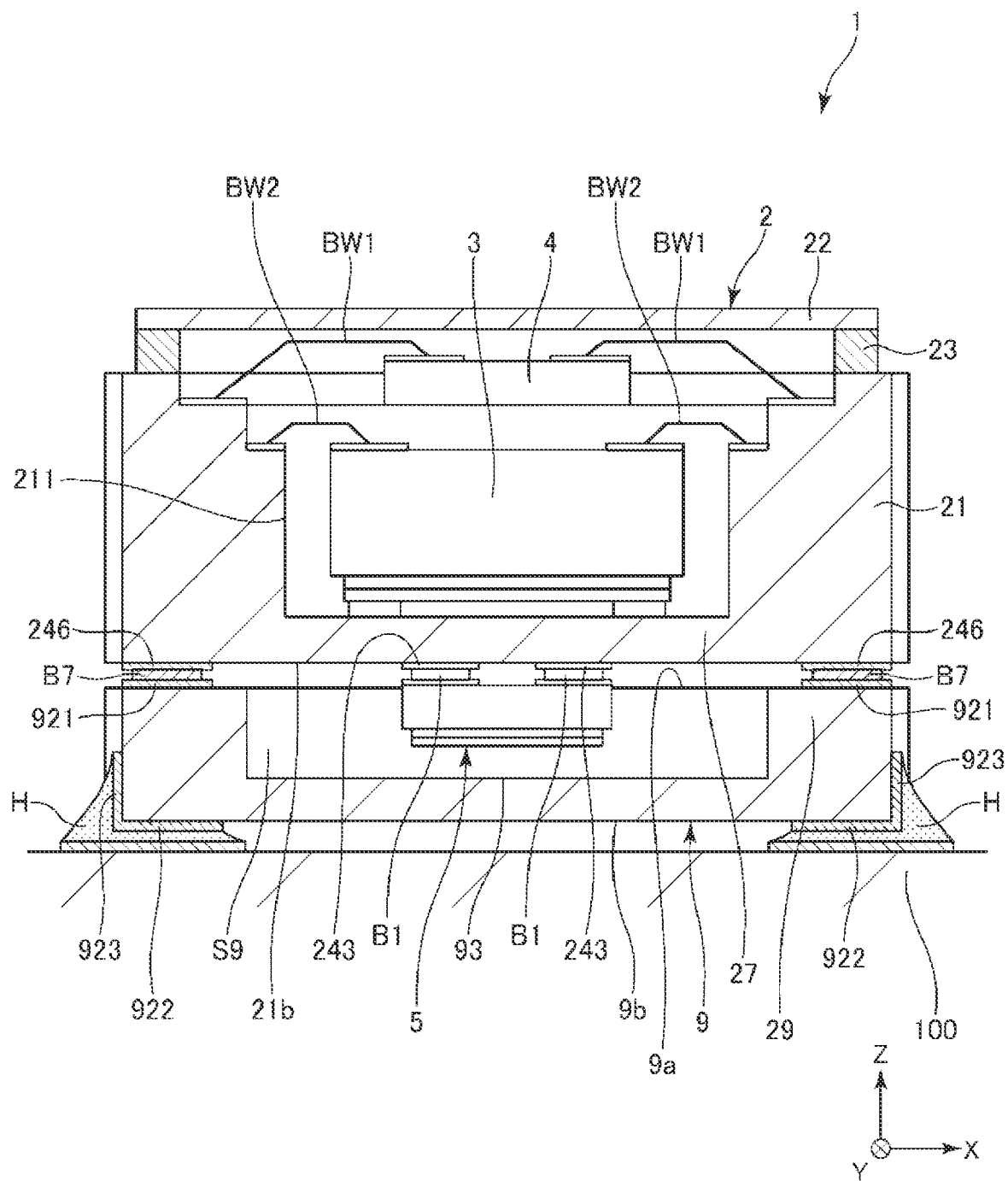
FIG. 16 is a cross-sectional view showing an oscillator according to a sixth embodiment.
Figure 17:
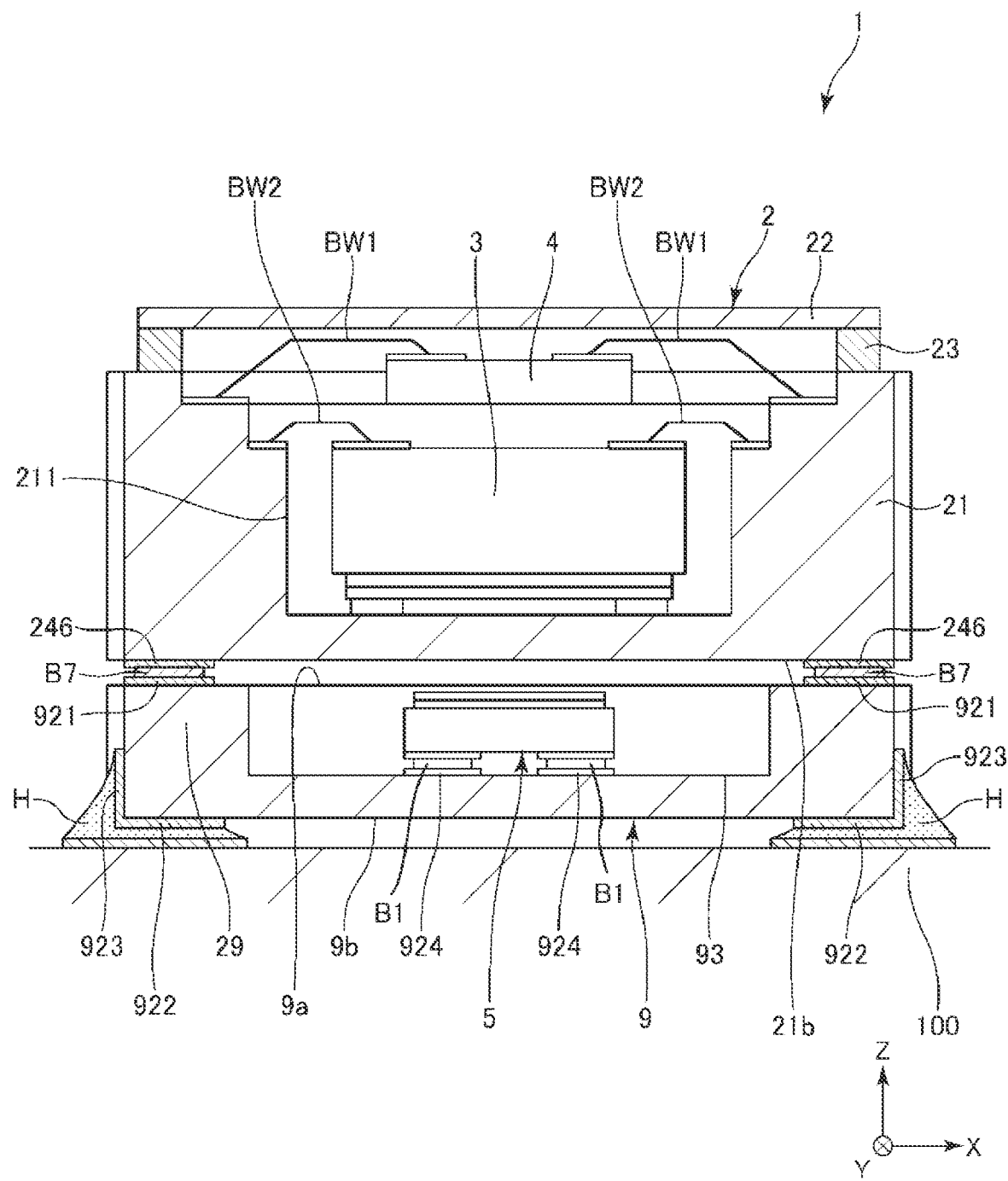
FIG. 17 is a cross-sectional view showing a modified example of the oscillator shown in FIG. 16.

FIG. 16 is a cross-sectional view showing an oscillator according to a sixth embodiment. FIG. 17 is a cross-sectional view showing a modified example of the oscillator shown in FIG. 16.

The oscillator 1 according to the present embodiment is substantially the same as the configuration shown in FIG. 15 described above except the point that the configuration of the leg part substrate 9 is different. Therefore, in the following description, the present embodiment will be described with a focus on the difference from the configuration shown in FIG. 15 described above, and the description of substantially the same issues will be omitted. Further, in each of the drawings in the present embodiment, the constituents substantially the same as those in the embodiments described above are denoted by the same reference symbols.

As shown in FIG. 16, in the oscillator 1 according to the present embodiment, the leg part substrate 9 has a recessed part 93 opening on the upper surface 9a. Further, the leg part substrate 9 is bonded to the lower surface 21b of the outer base 21 in the upper surface 9a thereof so as to house the voltage-controlled crystal oscillator 5 in the recessed part 93. Therefore, in the oscillator 1, at the lower surface 21b side of the substrate 27, there is formed a housing space S9 as a second housing space for housing the voltage-controlled crystal oscillator 5. Thus, it becomes more difficult for the voltage-controlled crystal oscillator 5 to be affected by the wind.

As described above, the oscillator 1 according to the present embodiment has the housing space S9 as the second housing space for housing the resonator element 55 at the lower surface side of the substrate 27. Thus, it becomes more difficult for the resonator element 55 to be affected by the wind.

According also to such a sixth embodiment as described hereinabove, there can be exerted substantially the same advantages as in the first embodiment described above. It should be noted that as a modified example of the present embodiment, it is possible for the voltage-controlled crystal oscillator 5 to be arranged on the bottom surface of the recessed part 93 as shown in, for example, FIG. 17.

Seventh Embodiment

Figure 18:
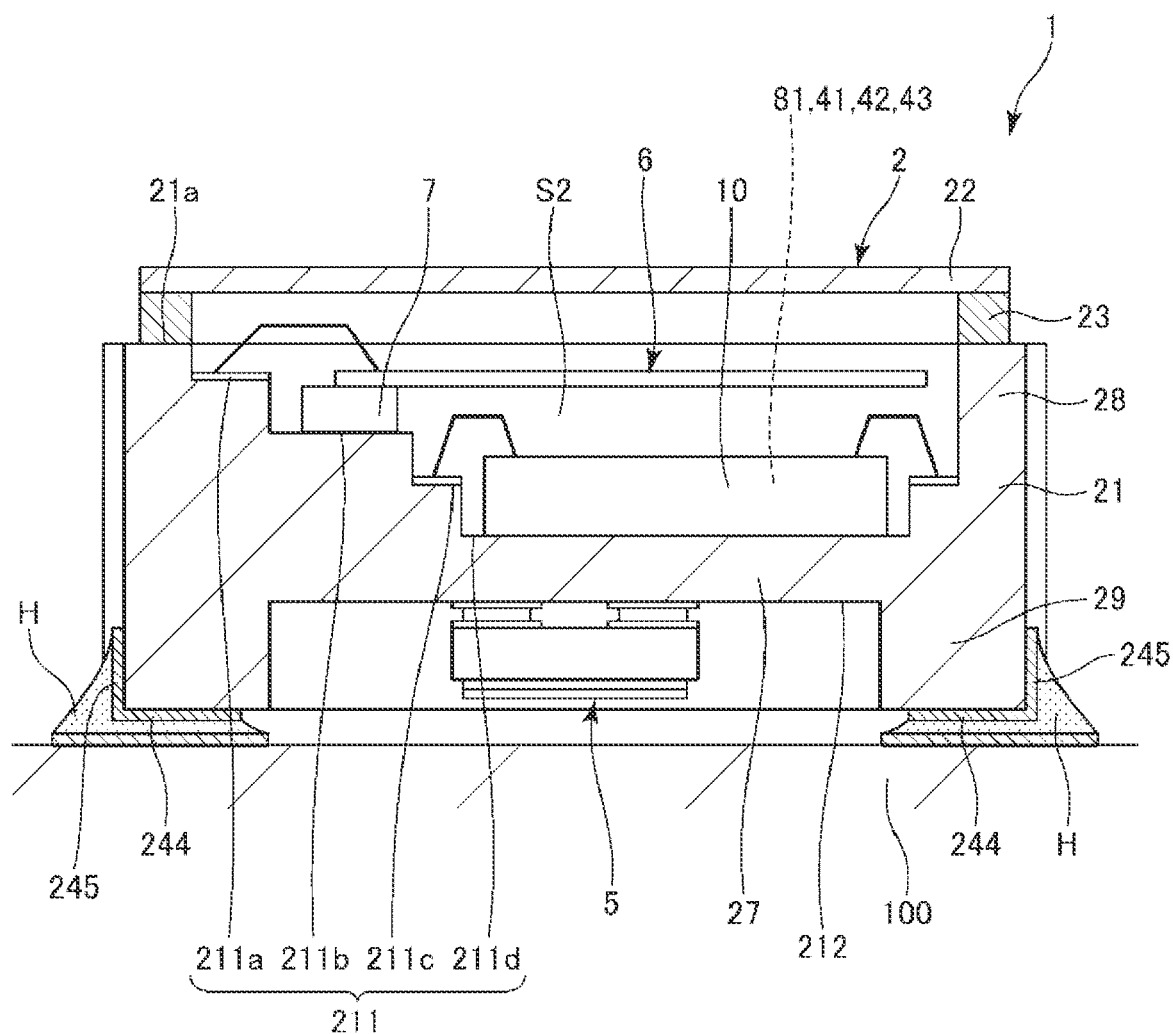
FIG. 18 is a cross-sectional view showing an oscillator according to a seventh embodiment.

FIG. 18 is a cross-sectional view showing an oscillator according to a seventh embodiment.

The oscillator 1 according to the present embodiment is substantially the same as in the first embodiment described above except the point that the inner package 3 is omitted. Therefore, in the following description, the present embodiment will be described with a focus on the difference from the first embodiment described above, and the description of substantially the same issues will be omitted. Further, in the drawings in the present embodiment, the constituents substantially the same as in the embodiments described above are denoted by the same reference symbols. Further, since the electrical coupling between the constituents is substantially the same as in the first embodiment described above, the description of the terminals and the bonding wires for electrically coupling the constituents to each other will be omitted.

As shown in FIG. 18, in the oscillator 1 according to the present embodiment, the upper recessed part 211 has the first upper recessed part 211a opening on the upper surface 21a, the second upper recessed part 211b which opens on the bottom surface of the first upper recessed part 211a, and is smaller in opening than the first upper recessed part 211a, the third upper recessed part 211c which opens on the bottom surface of the second upper recessed part 211b, and is smaller in opening than the second upper recessed part 211b, and a fourth upper recessed part 211d which opens on a bottom surface of the third upper recessed part 211c, and is smaller in opening than the third upper recessed part 211c. Further, the temperature control element 7 is arranged on the bottom surface of the second upper recessed part 211b, the resonator element 6 is arranged on the temperature control element 7, and a circuit element 10 is arranged on the bottom surface of the fourth upper recessed part 211d. It should be noted that the circuit element 10 is what is obtained by integrating the first circuit element 4 and the second circuit element 8 with each other, and includes the oscillation circuit 81, the temperature controlling circuit 41, the PLL circuit 42, and the output buffer circuit 43.

According to such a configuration, it is possible to achieve the reduction in size of the oscillator 1 compared to the first embodiment described above in accordance with the omission of the inner package 3.

According also to such a seventh embodiment as described hereinabove, there can be exerted substantially the same advantages as in the first embodiment described above.

Although the oscillator according to the present disclosure is described hereinabove based on the illustrated embodiments, the present disclosure is not limited thereto, and the configuration of each of the constituents can be replaced with one having substantially the same function and an arbitrary configuration. Further, the present disclosure can also be added with any other constituents. Further, it is also possible to arbitrarily combine any of the embodiments with each other.

What is claimed is:

1. An oscillator comprising:
   a first resonator element;
   a circuit element configured to oscillate the first resonator element to generate an oscillation signal;
   a first package which includes a substrate, and has a housing space configured to house the first resonator element and the circuit element at one principal surface of the substrate;
   a second resonator element which is disposed at another principal surface of the substrate, and an oscillation frequency of which is controlled based on the oscillation signal;
   a leg part which is disposed at the another principal surface of the substrate, and which is arranged so as to surround the second resonator element in a plan view of the substrate;
   an external terminal disposed on a top surface of the leg part; and
   an interconnection which is arranged inside the leg part, and which is electrically coupled to the external terminal.

2. The oscillator according to claim 1, further comprising:
   a side surface terminal which is arranged on a side surface of the leg part, and which is coupled to the external terminal.

3. The oscillator according to claim 1, wherein
   the leg part has a pair of unit leg parts arranged across the second resonator element, and
   the pair of unit leg parts each extend in a direction perpendicular to an arrangement direction of the pair of unit leg parts in a plan view of the substrate.

4. The oscillator according to claim 1, further comprising:
a second housing space configured to house the second resonator element at the another principal surface of the substrate.

5. The oscillator according to claim 1, wherein the leg part is formed separately from the substrate.

6. The oscillator according to claim 5, wherein
the leg part is a printed circuit board.

7. The oscillator according to claim 1, further comprising:
a heater configured to heat the first resonator element.

8. The oscillator according to claim 7, further comprising:
a second package configured to house the first resonator element and the heater, wherein
the second package is bonded to the substrate via a bonding member having an insulation property.

9. An oscillator comprising:
a first resonator element;
a circuit element configured to oscillate the first resonator element to generate an oscillation signal;
a first package which includes a substrate, and has a housing space configured to house the first resonator element and the circuit element at one principal surface of the substrate;
a second resonator element which is disposed at another principal surface of the substrate, and an oscillation frequency of which is controlled based on the oscillation signal; and
a leg part which is disposed at the another principal surface of the substrate, and which is arranged so as to surround the second resonator element in a plan view of the substrate, wherein
the leg part is shaped like a frame surrounding a whole circumference of the second resonator element in a plan view of the substrate.

10. The oscillator according to claim 9, further comprising:
an external terminal disposed on a top surface of the leg part; and
an interconnection which is arranged inside the leg part, and which is electrically coupled to the external terminal.

11. The oscillator according to claim 10, further comprising:
a side surface terminal which is arranged on a side surface of the leg part, and which is coupled to the external terminal.

12. The oscillator according to claim 9, further comprising:
a second housing space configured to house the second resonator element at the another principal surface of the substrate.

13. The oscillator according to claim 9, wherein
the leg part is formed integrally with the substrate.

14. The oscillator according to claim 9, wherein
the leg part is formed separately from the substrate.

15. The oscillator according to claim 14, wherein
the leg part is a printed circuit board.

16. An oscillator comprising:
a first resonator element;
a circuit element configured to oscillate the first resonator element to generate an oscillation signal;
a first package which includes a substrate, and has a housing space configured to house the first resonator element and the circuit element at one principal surface of the substrate;
a second resonator element which is disposed at another principal surface of the substrate, and an oscillation frequency of which is controlled based on the oscillation signal; and
a leg part which is disposed at the another principal surface of the substrate, wherein
the leg part is formed integrally with the substrate,
the leg part has at least two portions disposed across the second vibrating element, and
the two portions each extend to ends of the substrate in a direction perpendicular to an arrangement direction of the two portions in a plan view of the substrate.

17. The oscillator according to claim 16, wherein
the leg part is shaped like a frame surrounding a whole circumference of the second resonator element in a plan view of the substrate.

18. The oscillator according to claim 16, further comprising:
an external terminal disposed on a top surface of the leg part; and
an interconnection which is arranged inside the leg part, and which is electrically coupled to the external terminal.

19. The oscillator according to claim 18, further comprising:
a side surface terminal which is arranged on a side surface of the leg part, and which is coupled to the external terminal.

20. The oscillator according to claim 16, further comprising:
a second housing space configured to house the second resonator element at the another principal surface of the substrate.

* * * * *